(12) United States Patent
Meiri et al.

(10) Patent No.: US 10,055,161 B1
(45) Date of Patent: Aug. 21, 2018

(54) DATA REDUCTION TECHNIQUES IN A FLASH-BASED KEY/VALUE CLUSTER STORAGE

(71) Applicant: EMC Corporation, Hopkinton, MA (US)

(72) Inventors: David Meiri, Cambridge, MA (US); Anton Kucherov, Milford, MA (US); Vladimir Shveidel, Pardes-Hana (IL)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/001,784

(22) Filed: Jan. 20, 2016

Related U.S. Application Data

(62) Division of application No. 14/230,405, filed on Mar. 31, 2014.

(51) Int. Cl.
*G06F 3/06* (2006.01)
*G06F 11/20* (2006.01)

(52) U.S. Cl.
CPC .......... *G06F 3/0638* (2013.01); *G06F 3/0608* (2013.01); *G06F 3/0619* (2013.01); *G06F 3/0661* (2013.01); *G06F 3/0688* (2013.01); *G06F 11/2069* (2013.01); *G06F 2201/85* (2013.01)

(58) Field of Classification Search
None
See application file for complete search history.

(56) References Cited

U.S. PATENT DOCUMENTS

| | | | |
|---|---|---|---|
| 4,164,763 | A | 8/1979 | Briccetti et al. |
| 4,608,839 | A | 9/1986 | Tibbals, Jr. |
| 4,821,178 | A | 4/1989 | Levin et al. |
| 5,319,645 | A | 6/1994 | Bassi et al. |
| 5,537,534 | A | 7/1996 | Voigt et al. |
| 5,539,907 | A | 7/1996 | Srivastava et al. |

(Continued)

FOREIGN PATENT DOCUMENTS

| | | |
|---|---|---|
| EP | 1804157 | 7/2007 |
| WO | WO 2010/019596 | 2/2010 |

(Continued)

OTHER PUBLICATIONS

U.S. Appl. No. 15/085,168, filed Mar. 30, 2016, Meiri et al.

(Continued)

*Primary Examiner* — Jared I Rutz
*Assistant Examiner* — Stephanie Wu
(74) *Attorney, Agent, or Firm* — Daly, Crowley, Mofford & Durkee, LLP

(57) ABSTRACT

In one aspect, a method includes splitting empty RAID stripes into sub-stripes and storing pages into the sub-stripes based on a compressibility score. In another aspect, a method includes reading pages from 1-stripes, storing compressed data in a temporary location, reading multiple stripes, determining compressibility score for each stripe and filling stripes based on the compressibility score. In a further aspect, a method includes scanning a dirty queue in a system cache, compressing pages ready for destaging, combining compressed pages in to one aggregated page, writing one aggregated page to one stripe and storing pages with same compressibility score in a stripe.

19 Claims, 15 Drawing Sheets

(56) References Cited

U.S. PATENT DOCUMENTS

| | | |
|---|---|---|
| 5,627,995 A | 5/1997 | Miller et al. |
| 5,694,619 A | 12/1997 | Konno |
| 5,710,724 A | 1/1998 | Burrows |
| 5,732,273 A | 3/1998 | Srivastava et al. |
| 5,802,553 A | 9/1998 | Robinson et al. |
| 5,805,932 A | 9/1998 | Kawashima et al. |
| 5,860,137 A | 1/1999 | Raz et al. |
| 5,896,538 A | 4/1999 | Blandy et al. |
| 5,903,730 A | 5/1999 | Asai et al. |
| 5,940,618 A | 8/1999 | Blandy et al. |
| 5,940,841 A | 8/1999 | Schmuck et al. |
| 5,987,250 A | 11/1999 | Subrahmanyam |
| 5,999,842 A | 12/1999 | Harrison et al. |
| 6,182,086 B1 | 1/2001 | Lomet et al. |
| 6,208,273 B1 | 3/2001 | Dye et al. |
| 6,226,787 B1 | 5/2001 | Serra et al. |
| 6,327,699 B1 | 12/2001 | Larus et al. |
| 6,353,805 B1 | 3/2002 | Zahir et al. |
| 6,470,478 B1 | 10/2002 | Bargh et al. |
| 6,519,766 B1 | 2/2003 | Barritz et al. |
| 6,624,761 B2 | 9/2003 | Fallon |
| 6,643,654 B1 | 11/2003 | Patel et al. |
| 6,654,948 B1 | 11/2003 | Konum et al. |
| 6,658,471 B1 | 12/2003 | Berry et al. |
| 6,658,654 B1 | 12/2003 | Berry et al. |
| 6,691,209 B1 | 2/2004 | O'Connell |
| 6,801,914 B2 | 10/2004 | Barga et al. |
| 6,820,218 B1 | 11/2004 | Barga et al. |
| 6,870,929 B1 | 3/2005 | Greene |
| 7,099,797 B1 | 8/2006 | Richard |
| 7,143,410 B1 | 11/2006 | Coffman et al. |
| 7,190,284 B1 | 3/2007 | Dye et al. |
| 7,251,663 B1 | 7/2007 | Smith |
| 7,315,795 B2 | 1/2008 | Homma |
| 7,389,497 B1 | 6/2008 | Edmark et al. |
| 7,421,681 B2 | 9/2008 | DeWitt, Jr. et al. |
| 7,552,125 B1 | 6/2009 | Evans |
| 7,574,587 B2 | 8/2009 | DeWitt, Jr. et al. |
| 7,672,005 B1 | 3/2010 | Hobbs et al. |
| 7,693,999 B2 | 4/2010 | Park |
| 7,714,747 B2 | 5/2010 | Fallon |
| 7,814,218 B1 | 10/2010 | Knee et al. |
| 7,827,136 B1 | 11/2010 | Wang et al. |
| 7,898,442 B1 | 3/2011 | Sovik |
| 7,908,436 B1 | 3/2011 | Srinivasan et al. |
| 7,962,664 B2 | 6/2011 | Gotch et al. |
| 8,200,923 B1 | 6/2012 | Healey et al. |
| 8,335,899 B1 | 12/2012 | Meiri et al. |
| 8,478,951 B1 | 7/2013 | Healey et al. |
| 8,560,926 B2 | 10/2013 | Yeh |
| 8,880,788 B1 | 11/2014 | Sundaram et al. |
| 9,037,822 B1 | 5/2015 | Meiri et al. |
| 9,104,326 B2 | 8/2015 | Frank et al. |
| 9,208,162 B1 | 12/2015 | Hallak et al. |
| 9,270,592 B1 | 2/2016 | Sites |
| 9,286,003 B1 | 3/2016 | Hallak et al. |
| 9,304,889 B1 | 4/2016 | Chen et al. |
| 9,317,362 B2 | 4/2016 | Khan |
| 9,342,465 B1 | 5/2016 | Meiri |
| 9,378,106 B1 | 6/2016 | Ben-Moshe et al. |
| 9,396,243 B1 | 7/2016 | Halevi et al. |
| 9,418,131 B1 | 8/2016 | Halevi et al. |
| 9,762,460 B2 | 9/2017 | Pawlowski et al. |
| 9,785,468 B2 | 10/2017 | Mitchell et al. |
| 2001/0054131 A1 | 12/2001 | Alvarez, II et al. |
| 2002/0056031 A1 | 5/2002 | Skiba et al. |
| 2003/0023656 A1 | 1/2003 | Hutchison et al. |
| 2003/0126122 A1 | 7/2003 | Bosley et al. |
| 2003/0131184 A1 | 7/2003 | Kever |
| 2003/0145251 A1 | 7/2003 | Cantrill |
| 2004/0267835 A1 | 12/2004 | Zwilling et al. |
| 2005/0039171 A1 | 2/2005 | Avakian et al. |
| 2005/0071579 A1 | 3/2005 | Luick |
| 2005/0125626 A1 | 6/2005 | Todd |
| 2005/0144416 A1 | 6/2005 | Lin |
| 2005/0171937 A1 | 8/2005 | Hughes et al. |
| 2005/0193084 A1 | 9/2005 | Todd et al. |
| 2005/0278346 A1 | 12/2005 | Shang et al. |
| 2006/0031653 A1 | 2/2006 | Todd et al. |
| 2006/0031787 A1 | 2/2006 | Ananth et al. |
| 2006/0070076 A1 | 3/2006 | Ma |
| 2006/0123212 A1 | 6/2006 | Yagawa |
| 2006/0242442 A1 | 10/2006 | Armstrong et al. |
| 2007/0208788 A1 | 9/2007 | Chakravarty et al. |
| 2008/0082736 A1 | 4/2008 | Chow et al. |
| 2008/0163215 A1 | 7/2008 | Jiang et al. |
| 2008/0178050 A1 | 7/2008 | Kern et al. |
| 2008/0288739 A1 | 11/2008 | Bamba et al. |
| 2009/0006745 A1 | 1/2009 | Cavallo et al. |
| 2009/0030986 A1 | 1/2009 | Bates |
| 2009/0089483 A1 | 4/2009 | Tanaka et al. |
| 2009/0172273 A1 | 7/2009 | Piszczek et al. |
| 2009/0222596 A1 | 9/2009 | Flynn et al. |
| 2009/0248986 A1* | 10/2009 | Citron ............... G06F 12/0848 711/129 |
| 2009/0319996 A1 | 12/2009 | Shafi et al. |
| 2010/0042790 A1 | 2/2010 | Mondal et al. |
| 2010/0161884 A1 | 6/2010 | Kurashige |
| 2010/0180145 A1 | 7/2010 | Chu |
| 2010/0199066 A1 | 8/2010 | Artan et al. |
| 2010/0205330 A1 | 8/2010 | Noborikawa et al. |
| 2010/0223619 A1 | 9/2010 | Jaquet et al. |
| 2010/0257149 A1 | 10/2010 | Cognigni et al. |
| 2010/0287427 A1 | 11/2010 | Kim et al. |
| 2011/0078494 A1 | 3/2011 | Maki et al. |
| 2011/0083026 A1 | 4/2011 | Mikami et al. |
| 2011/0099342 A1 | 4/2011 | Ozdemir |
| 2011/0126045 A1* | 5/2011 | Bennett ............... G06F 11/1068 714/6.22 |
| 2011/0202744 A1 | 8/2011 | Kulkarni et al. |
| 2011/0225122 A1 | 9/2011 | Denuit et al. |
| 2012/0054472 A1 | 3/2012 | Altman et al. |
| 2012/0124282 A1 | 5/2012 | Frank et al. |
| 2012/0278793 A1 | 11/2012 | Jalan et al. |
| 2012/0290546 A1 | 11/2012 | Smith et al. |
| 2012/0290798 A1* | 11/2012 | Huang ............... G06F 3/0608 711/154 |
| 2012/0304024 A1 | 11/2012 | Rohleder et al. |
| 2013/0031077 A1 | 1/2013 | Liu et al. |
| 2013/0054524 A1 | 2/2013 | Anglin et al. |
| 2013/0073527 A1 | 3/2013 | Bromley |
| 2013/0110783 A1 | 5/2013 | Wertheimer et al. |
| 2013/0111007 A1 | 5/2013 | Hoffmann et al. |
| 2013/0138607 A1 | 5/2013 | Bashyam et al. |
| 2013/0151759 A1 | 6/2013 | Shim et al. |
| 2013/0198854 A1 | 8/2013 | Erway et al. |
| 2013/0227346 A1 | 8/2013 | Lee |
| 2013/0246724 A1 | 9/2013 | Furuya |
| 2013/0265883 A1 | 10/2013 | Henry et al. |
| 2013/0318051 A1 | 11/2013 | Kumar et al. |
| 2013/0339533 A1 | 12/2013 | Neerincx et al. |
| 2014/0032964 A1 | 1/2014 | Neerincx et al. |
| 2014/0082261 A1 | 3/2014 | Cohen et al. |
| 2014/0136759 A1 | 5/2014 | Sprouse et al. |
| 2014/0143206 A1 | 5/2014 | Pittelko |
| 2014/0195484 A1 | 7/2014 | Wang et al. |
| 2014/0380282 A1 | 12/2014 | Ravindranath Sivalingam et al. |
| 2015/0006910 A1 | 1/2015 | Shapiro |
| 2015/0088823 A1 | 3/2015 | Chen et al. |
| 2015/0088945 A1 | 3/2015 | Kruus et al. |
| 2015/0134880 A1* | 5/2015 | Danilak ............... G06F 12/0246 711/103 |
| 2015/0161194 A1 | 6/2015 | Provenzano et al. |
| 2015/0193342 A1 | 7/2015 | Ohara et al. |
| 2016/0004642 A1* | 1/2016 | Sugimoto ............... G06F 3/06 711/128 |
| 2016/0034692 A1 | 2/2016 | Singler |

FOREIGN PATENT DOCUMENTS

| | | |
|---|---|---|
| WO | WO 2010/040078 | 4/2010 |
| WO | WO 2012/066528 | 5/2012 |

(56) References Cited

FOREIGN PATENT DOCUMENTS

OTHER PUBLICATIONS

U.S. Appl. No. 15/076,775, filed Mar. 22, 2016, Chen et al.
U.S. Appl. No. 15/076,946, filed Mar. 22, 2016, Meiri.
U.S. Appl. No. 15/085,172, filed Mar. 30, 2016, Meiri.
U.S. Appl. No. 15/085,181, filed Mar. 30, 2016, Meiri et al.
U.S. Appl. No. 15/085,188, filed Mar. 30, 2016, Meiri et al.
Notice of Allowance dated Feb. 26, 2016 corresponding to U.S. Appl. No. 14/230,414; 8 Pages.
U.S. Appl. No. 14/979,890, filed Dec. 28, 2015, Meiri et al.
Office Action dated Feb. 4, 2016 for U.S. Appl. No. 14/037,577; 26 Pages.
Notice of Allowance dated Feb. 10, 2016 for U.S. Appl. No. 14/494,899; 19 Pages.
Notice of Allowance dated Jun. 6, 2016 corresponding to U.S. Appl. No. 14/317,449; 43 Pages.
Notice of Allowance dated May 20, 2016 corresponding to U.S. Appl. No. 14/037,577; 19 Pages.
Final Office Action dated Apr. 6, 2016 corresponding to U.S. Appl. No. 14/034,981; 38 Pages.
Response filed on May 2, 2016 to the Non-Final Office Action dated Dec. 1, 2015; for U.S. Appl. No. 14/230,405; 8 pages.
Response filed on May 2, 2016 to the Non-Final Office Action dated Feb. 4, 2016; for U.S. Appl. No. 14/037,577; 10 pages.
U.S. Appl. No. 15/196,674, filed Jun. 29, 2016, Kleiner et al.
U.S. Appl. No. 15/196,427, filed Jun. 29, 2016, Shveidel.
U.S. Appl. No. 15/196,374, filed Jun. 29, 2016, Shveidel et al.
U.S. Appl. No. 15/196,447, filed Jun. 29, 2016, Shveidel et al.
U.S. Appl. No. 15/196,472, filed Jun. 29, 2016, Shveidel.
Response to U.S. Final Office Action dated Apr. 6, 2016 corresponding to U.S. Appl. No. 14/034,981; Response filed on Jun. 16, 2016; 11 Pages.
Notice of Allowance dated Jun. 29, 2016 corresponding to U.S. Appl. No. 14/034,981; 14 Pages.
U.S. Final Office Action dated Jul. 29, 2016 corresponding to U.S. Appl. No. 14/230,405; 29 Pages.
U.S. Appl. No. 14/034,981, filed Sep. 24, 2013, Halevi et al.
U.S. Appl. No. 14/037,577, filed Sep. 26, 2013, Ben-Moshe et al.
U.S. Appl. No. 14/230,405, filed Mar. 31, 2014, Meiri et al.
U.S. Appl. No. 15/001,789, filed Jan. 20, 2016, Meiri et al.
U.S. Appl. No. 14/230,414, filed Mar. 31, 2014, Meiri.
U.S. Appl. No. 14/317,449, filed Jun. 27, 2014, Halevi et al.
U.S. Appl. No. 14/494,895, filed Sep. 24, 2014, Meiri et al.
U.S. Appl. No. 14/494,899, filed Sep. 24, 2014, Chen et al.
PCT International Search Report and Written Opinion dated Dec. 1, 2011 for PCT Application No. PCT/IL2011/000692; 11 Pages.
PCT International Preliminary Report dated May 30, 2013 for PCT Patent Application No. PCT/IL2011/000692; 7 Pages.
U.S. Appl. No. 12/945,915.
Notice of Allowance dated Apr. 13, 2015 corresponding to U.S. Appl. No. 14/037,511; 11 Pages.
Non-Final Office Action dated May 11, 2015 corresponding to U.S. Appl. No. 14/037,626; 13 Pages.
Response to Office Action dated May 11, 2015 corresponding to U.S. Appl. No. 14/037,626; Response filed on Jul. 20, 2015; 10 Pages.
Notice of Allowance dated Oct. 26, 2015 corresponding to U.S. Appl. No. 14/037,626; 12 Pages.
Office Action dated Jul. 22, 2015 corresponding to U.S. Appl. No. 14/034,981; 28 Pages.
Response to Office Action dated Jul. 22, 2015 corresponding to U.S. Appl. No. 14/034,981; Response filed on Dec. 22, 2015; 14 Pages.
Office Action dated Sep. 1, 2015 corresponding to U.S. Appl. No. 14/230,414; 13 Pages.
Response to Office Action dated Sep. 1, 2015 corresponding to U.S. Appl. No. 14/230,414; Response filed on Jan. 14, 2016; 10 Pages.
Restriction Requirement dated Sep. 24, 2015 corresponding to U.S. Appl. No. 14/230,405; 8 Pages.
Response to Restriction Requirement dated Sep. 24, 2015 corresponding to U.S. Appl. No. 14/230,405;Response filed Oct. 6, 2015; 1 Page.
Office Action dated Dec. 1, 2015 corresponding to U.S. Appl. No. 14/230,405;17 Pages.
Nguyen et al., "B+ Hash Tree: Optimizing Query Execution Times for on-Disk Semantic Wed Data Structures;" Proceedings of the $6^{th}$ International Workshop on Scalable Semantic Web Knowledge Base Systems; Shanghai, China, Nov. 8, 2010; 16 Pages.
Response to U.S. Office Action dated Sep. 9, 2016 corresponding to U.S. Appl. No. 15/001,789; Response filed on Dec. 8, 2016; 15 Pages.
Notice of Allowance dated Jan. 25, 2017 for U.S. Appl. No. 14/230,405; 8 Pages.
Final Office Action dated Nov. 16, 2016 from U.S. Appl. No. 14/230,405, 23 Pages.
U.S. Office Action dated Sep. 9, 2016 corresponding to U.S. Appl. No. 15/001,789; 29 Pages.
Response to U.S. Office Action dated Jul. 29, 2016 corresponding to U.S. Appl. No. 14/230,405; Response filed on Oct. 6, 2016; 9 Pages.
Response to U.S. Final Office Action dated Nov. 16, 2016 corresponding to U.S. Appl. No. 14/230,405; Response filed on Dec. 1, 2016; 8 Pages.
U.S. Final Office Action dated Mar. 9, 2017 for U.S. Appl. No. 15/001,789; 40 pages.
Response to U.S. Final Office Action dated Mar. 9, 2017 for U.S. Appl. No. 15/001,789; Response filed Jun. 9, 2017; 12 pages.
U.S. Non-Final Office Action dated Jul. 6, 2017 for U.S. Appl. No. 14/494,895; 36 pages.
Response to U.S. Non-Final Office Action dated Jul. 6, 2017 for U.S. Appl. No. 14/494,895; Response filed Oct. 3, 2017; 10 pages.
U.S. Non-Final Office Action dated Oct. 31, 2017 for U.S. Appl. No. 15/001,789; 38 pages.
U.S. Final Office Action dated Nov. 2, 2017 for U.S. Appl. No. 14/494,895; 12 pages.
U.S. Non-Final Office Action dated Dec. 1, 2017 for U.S. Appl. No. 14/979,890; 10 pages.
U.S. Notice of Allowance dated Feb. 21, 2018 for U.S. Appl. No. 15/196,427; 31 Pages.
U.S. Non-Final Office Action dated Dec. 29, 2017 corresponding to U.S. Appl. No. 15/196,674; 34 Pages.
U.S. Non-Final Office Action dated Nov. 1, 2017 corresponding to U.S. Appl. No. 15/196,374; 64 Pages.
Response to U.S. Non-Final Office Action dated Nov. 1, 2017 corresponding to U.S. Appl. No. 15/196,374; Response filed Jan. 30, 2018; 14 Pages.
U.S. Non-Final Office Action dated Dec. 11, 2017 corresponding to U.S. Appl. No. 15/196,447; 54 Pages.
U.S. Non-Final Office Action dated Jan. 8, 2018 corresponding to U.S. Appl. No. 15/196,472; 16 Pages.
Response to U.S. Non-Final Office Action dated Oct. 31, 2017 corresponding to U.S. Appl. No. 15/001,789; Response filed Jan. 30, 2018; 9 Pages.
U.S. Final Office Action dated Apr. 18, 2018 for U.S. Appl. No. 15/001,789; 27 Pages.

* cited by examiner

DATA REDUCTION TECHNIQUES IN A FLASH-BASED KEY/VALUE CLUSTER STORAGE

RELATED PATENT APPLICATIONS

This patent application is a divisional application of U.S. patent application Ser. No. 14/230,405, filed on Mar. 31, 2014 and entitled "DATA REDUCTION TECHNIQUES IN A FLASH-BASED KEY/VALUE CLUSTER STORAGE," which is incorporated herein by reference in its entirety.

BACKGROUND

Storage systems in general, and block based storage systems specifically, are a key element in modern data centers and computing infrastructure. These systems are designed to store and retrieve large amounts of data, by providing data block address and data block content—for storing a block of data—and by providing a data block address for retrieval of the data block content that is stored at the specified address.

Storage solutions are typically partitioned into categories based on a use case and application within a computing infrastructure, and a key distinction exists between primary storage solutions and archiving storage solutions. Primary storage is typically used as the main storage pool for computing applications during application run-time. As such, the performance of primary storage systems is very often a key challenge and a major potential bottleneck in overall application performance, since storage and retrieval of data consumes time and delays the completion of application processing. Storage systems designed for archiving applications are much less sensitive to performance constraints, as they are not part of the run-time application processing.

In general computer systems grow over their lifetime and the data under management tends to grow over the system lifetime. Growth can be exponential, and in both primary and archiving storage systems, exponential capacity growth typical in modern computing environment presents a major challenge as it results in increased cost, space, and power consumption of the storage systems required to support ever increasing amounts of information.

Existing storage solutions, and especially primary storage solutions, rely on address-based mapping of data, as well as address-based functionality of the storage system's internal algorithms. This is only natural since the computing applications always rely on address-based mapping and identification of data they store and retrieve. However, a completely different scheme in which data, internally within the storage system, is mapped and managed based on its content instead of its address has many substantial advantages. For example, it improves storage capacity efficiency since any duplicate block data will only occupy actual capacity of a single instance of that block. As another example, it improves performance since duplicate block writes do not need to be executed internally in the storage system. Existing storage systems, either primary storage systems or archiving storage systems are incapable of supporting the combination of content based storage—with its numerous advantages—and ultra-high performance. This is a result of the fact that the implementation of content based storage scheme faces several challenges:

(a) intensive computational load which is not easily distributable or breakable into smaller tasks, (b) an inherent need to break large blocks into smaller block sizes in order to achieve content addressing at fine granularity. This block fragmentation dramatically degrades the performance of existing storage solutions, (c) inability to maintain sequential location of data blocks within the storage systems, since mapping is not address based any more, and such inability causes dramatic performance degradation with traditional spinning disk systems, (d) the algorithmic and architectural difficulty in distributing the tasks associated with content based mapping over a large number of processing and storage elements while maintaining single content-addressing space over the full capacity range of the storage system.

A number of issues arise with respect to such devices, and it is necessary to consider such issues as performance, lifetime and resilience to failure of individual devices, overall speed of response and the like.

Such devices may be used in highly demanding circumstances where failure to process data correctly can be extremely serious, or where large scales are involved, and where the system has to be able to cope with sudden surges in demand.

SUMMARY

In one aspect, a method includes splitting empty RAID stripes into sub-stripes and storing pages into the sub-stripes based on a compressibility score. In another aspect, a method includes reading pages from 1-stripes, storing compressed data in a temporary location, reading multiple stripes, determining compressibility score for each stripe and filling stripes based on the compressibility score. In a further aspect, a method includes scanning a dirty queue in a system cache, compressing pages ready for destaging, combining compressed pages in to one aggregated page, writing one aggregated page to one stripe and storing pages with same compressibility score in a stripe.

In one aspect, an apparatus includes electronic hardware circuitry configured to split empty RAID stripes into sub-stripes and store pages into the sub-stripes based on a compressibility score. In another aspect, an apparatus includes electronic hardware circuitry configured to read pages from 1-stripes, store compressed data in a temporary location, read multiple stripes, determine compressibility score for each stripe and fill stripes based on the compressibility score. In a further aspect, an apparatus includes electronic hardware circuitry configured to scan a dirty queue in a system cache, compress pages ready for destaging, combine compressed pages in to one aggregated page, write one aggregated page to one stripe and store pages with same compressibility score in a stripe.

In several aspects, an article includes a non-transitory computer-readable medium that stores computer-executable instructions. In one aspect, the instructions cause a machine to split empty RAID stripes into sub-stripes and store pages into the sub-stripes based on a compressibility score. In another aspect, the instructions cause a machine to read pages from 1-stripes, store compressed data in a temporary location, read multiple stripes, determine compressibility score for each stripe and fill stripes based on the compressibility score. In a further aspect, the instructions cause a machine to scan a dirty queue in a system cache, compress pages ready for destaging, combine compressed pages in to one aggregated page, write one aggregated page to one stripe and store pages with same compressibility score in a stripe.

DETAILED DESCRIPTION

Figure 1:
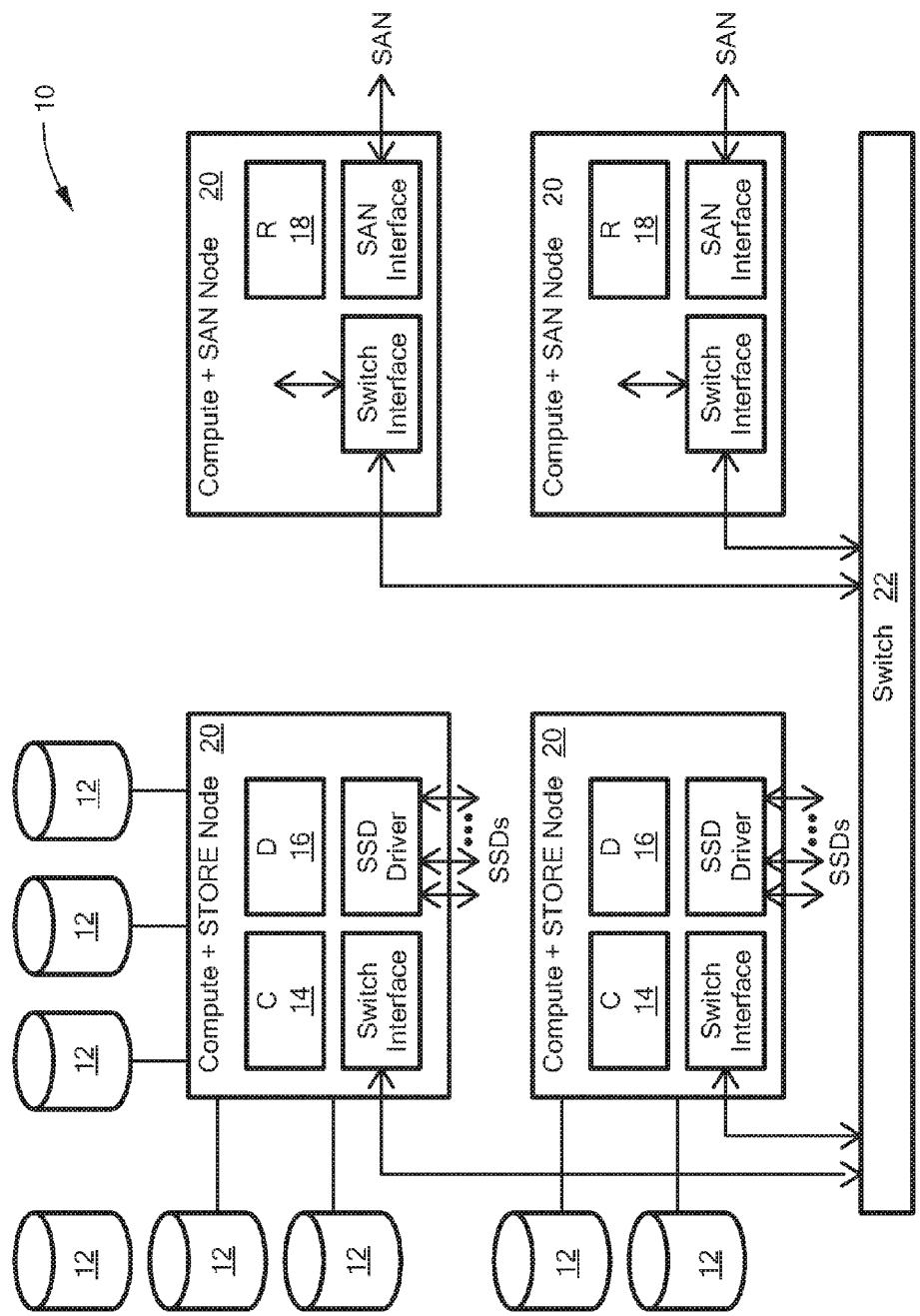
FIG. 1 is a simplified diagram schematically illustrating a system for data storage, having separate control and data planes.

Described herein are data reduction techniques that may be used in a flash-based key/value cluster storage array. The techniques described herein enable the array to compress/decompress much faster than previously know techniques, while preserving the array logical block structure and all other services including, but not limited to, deduplication, snapshots, replication and so forth. In one example, pages can be compressed and decompressed in parallel, giving a significant performance boost.

In a Content Addressable Storage (CAS) array, data is stored in blocks, for example of 4 KB, where each block has a unique large hash signature, for example of 20 bytes, saved on Flash memory.

The examples described herein include a networked memory system. The networked memory system includes multiple memory storage units arranged for content addressable storage of data. The data is transferred to and from the storage units using separate data and control planes. Hashing is used for the content addressing, and the hashing produces evenly distributed results over the allowed input range. The hashing defines the physical addresses so that data storage makes even use of the system resources.

A relatively small granularity may be used, for example with a page size of 4 KB, although smaller or larger block sizes may be selected at the discretion of the skilled person. This enables the device to detach the incoming user access pattern from the internal access pattern. That is to say the incoming user access pattern may be larger than the 4 KB or other system-determined page size and may thus be converted to a plurality of write operations within the system, each one separately hashed and separately stored.

Content addressable data storage can be used to ensure that data appearing twice is stored at the same location. Hence unnecessary duplicate write operations can be identified and avoided. Such a feature may be included in the present system as data deduplication. As well as making the system more efficient overall, it also increases the lifetime of those storage units that are limited by the number of write/erase operations.

The separation of Control and Data may enable a substantially unlimited level of scalability, since control operations can be split over any number of processing elements, and data operations can be split over any number of data storage elements. This allows scalability in both capacity and performance, and may thus permit an operation to be effectively balanced between the different modules and nodes.

The separation may also help to speed the operation of the system. That is to say it may speed up Writes and Reads. Such may be due to:

(a) Parallel operation of certain Control and Data actions over multiple Nodes/Modules (b) Use of optimal internal communication/networking technologies per the type of operation (Control or Data), designed to minimize the latency (delay) and maximize the throughput of each type of operation.

Also, separation of control and data paths may allow each Control or Data information unit to travel within the system between Nodes or Modules in the optimal way, meaning only to where it is needed and if/when it is needed. The set of optimal where and when coordinates is not the same for control and data units, and hence the separation of paths ensures the optimization of such data and control movements, in a way which is not otherwise possible. The separation is important in keeping the workloads and internal communications at the minimum necessary, and may translate into increased optimization of performance.

De-duplication of data, meaning ensuring that the same data is not stored twice in different places, is an inherent effect of using Content-Based mapping of data to D-Modules and within D-Modules.

Scalability is inherent to the architecture. Nothing in the architecture limits the number of the different R, C, D, and H modules which are described further herein. Hence any number of such modules can be assembled. The more modules added, the higher the performance of the system becomes and the larger the capacity it can handle. Hence scalability of performance and capacity is achieved.

The principles and operation of an apparatus and method according to the present invention may be better understood with reference to the drawings and accompanying description.

Reference is now made to FIG. 1 which illustrates a system 10 for scalable block data storage and retrieval using content addressing. The system 10 includes data storage devices 12 on which the data blocks are stored. The storage devices 12 are networked to computing modules, there being several kinds of modules, including control modules 14 and data modules 16. The modules carry out content addressing for storage and retrieval, and the network defines separate paths or planes, control paths or a control plane which goes via the control modules 14 and data paths or a data plane which goes via the data modules 16.

The control modules 14 may control execution of read and write commands. The data modules 16 are connected to the storage devices and, under control of a respective control module, pass data to or from the storage devices. Both the C and D modules may retain extracts of the data stored in the storage device, and the extracts may be used for the content addressing. Typically the extracts may be computed by cryptographic hashing of the data, as will be discussed in greater detail below, and hash modules (FIG. 2) may specifically be provided for this purpose. That is to say the hash modules calculate hash values for data which is the subject of storage commands, and the hash values calculated may later be used for retrieval.

Routing modules 18 may terminate storage and retrieval operations and distribute command parts of any operations to control modules that are explicitly selected for the operation in such a way as to retain balanced usage within the system 10.

The routing modules may use hash values, calculated from data associated with the operations, to select the control module for the distribution. More particularly, selection of the control module may use hash values, but typically relies on the user address and not on the content (hash). The hash value is, however, typically used for selecting the Data (D) module, and for setting the physical location for data storage within a D module.

The storage devices may be solid state random access storage devices, as opposed to spinning disk devices; however disk devices may be used instead or in addition.

A deduplication feature may be provided. The routing modules and/or data modules may compare the extracts or hash values of write data with hash values of already stored data, and where a match is found, simply point to the matched data and avoid rewriting.

The modules are combined into nodes 20 on the network, and the nodes are connected over the network by a switch 22.

The use of content addressing with multiple data modules selected on the basis of the content hashing, and a finely-grained mapping of user addresses to Control Modules allow for a scalable distributed architecture.

A glossary is now given of terms used in the following description:

X-PAGE—A predetermined-size aligned chunk as the base unit for memory and disk operations. Throughout the present description the X-Page size is referred to as having 4 KB, however other smaller or larger values can be used as well and nothing in the design is limited to a specific value.

LUN or LOGICAL UNIT NUMBER, is a common name in the industry for designating a volume of data, or a group of data blocks being named with the LUN. Each data block is referred to, by the external user of the storage system, according to its LUN, and its address within this LUN LOGICAL X-PAGE ADDRESS—Logical address of an X-Page. The address contains a LUN identifier as well as the offset of the X-Page within the LUN.

LOGICAL BLOCK—512 bytes (sector) aligned chunk, which is the SCSI base unit for disk operations.

LOGICAL BLOCK ADDRESS—Logical address of a Logical Block. The logical block address contains a LUN identifier as well as the offset of the logical block within the LUN.

SUB-LUN—Division of a LUN to smaller logical areas, to balance the load between C modules. Each such small logical area is called a sub-LUN.

SUB-LUN UNIT SIZE—The fixed size of a sub-LUN. X-Page Data—Specific sequence of user data values that resides in an X-Page. Each such X-Page Data is uniquely represented in the system by its hash digest.

D PRIMARY—The D module responsible for storing an X-Page's Data

D BACKUP—The D module responsible for storing a backup for an X-Page Data. The backup is stored in a non-volatile way (NVRAM or UPS protected).

Acronyms:

LXA—Logical X-Page Address.
LB—Logical Block.
LBA—Logical Block Address.
AUS—Atomic Unit Size.
SL—Sub-LUN.
SLUS—Sub-LUN Unit Size.
MBE—Management Back End.

The examples described herein to a block-level storage system, offering basic and advanced storage functionality. The design may be based on a distributed architecture, where computational, Storage Area Networking (SAN), and storage elements are distributed over multiple physical Nodes, with all such Nodes being inter-connected over an internal network through a switch device. The distributed architecture enables the scaling of the system's capabilities in multiple aspects, including overall storage capacity, performance characteristics in bandwidth and I/O operations per second (IOPS), computational resources, internal and external networking bandwidth, and other. While being based on a distributed architecture, the system presents, externally, a unified storage system entity with scalable capabilities.

The system's architecture and internal algorithms implementing the basic and advanced storage functions are optimized for improved utilization of the capabilities of random-access memory/storage media, as opposed to contrast with mechanical-magnetic spinning disk storage media. The optimizations are implemented in the design itself, and may, for example, include the ability to break incoming writes into smaller blocks and distribute the operation over different Nodes. Such an adaptation is particularly suitable for random access memory/storage media but is less suitable in a spinning-disk environment, as it would degrade performance to extremely low levels. The adaptation includes the content/hash based mapping of data distributes the data over different D Nodes in general and within D Nodes over different SSD devices. Again, such a scheme is more suitable for random access memory/storage media than for a spinning-disk media because such spread of data blocks would result in very poor performance in the spinning disk case. That is to say, the described elements of the present architecture are designed to work well with random access media, and achieve benefits in performance, scalability, and functionality such as inline deduplication. Such random-access memory media can be based on any or a combination of flash memory, DRAM, phase change memory, or other memory technology, whether persistent or non-persistent, and is typically characterized by random seek/access times and random read/write speeds substantially higher than those exhibited by spinning disk media. The system's internal data block mapping, the algorithms implementing advanced storage functions, and the algorithms for protecting data stored in the system are designed to provide storage performance and advanced storage functionality at substantially higher performance, speed, and flexibility than those available with alternative storage systems.

Data mapping within the system is designed not only to improve performance, but also to improve the life span and reliability of the electronic memory media, in cases where the memory technology used has limitations on write/erase cycles, as is the case with flash memory. Lifetime maximization may be achieved by avoiding unnecessary write operations as will be explained in greater detail below. For the purpose of further performance optimization, life span maximization, and cost optimization, the system may employ more than a single type of memory technology, including a mix of more than one Flash technology (e.g., single level cell—SLC flash and multilevel cell—MLC flash), and a mix of Flash and DRAM technologies. The data mapping optimizes performance and life span by taking advantage of the different access speeds and different write/erase cycle limitations of the various memory technologies.

The core method for mapping blocks of data internally within the system is based on Content Addressing, and is implemented through a distributed Content Addressable Storage (CAS) algorithm.

This scheme maps blocks of data internally according to their content, resulting in mapping of identical block to the same unique internal location. The distributed CAS algorithm allows for scaling of the CAS domain as overall system capacity grows, effectively utilizing and balancing the available computational and storage elements in order to improve overall system performance at any scale and with any number of computational and storage elements.

The system supports advanced In-line block level deduplication, which may improve performance and save capacity.

Elements of the system's functionality are: Write (store) data block at a specified user address; Trim data block at a specified user address; Read data block from a specified user address; and In-line block level deduplication.

The following features may be provided: (1) A distributed CAS based storage optimized for electronic random-access storage media; The optimization includes utilizing storage algorithms, mainly the content-based uniformly-distributed mapping of data, that inherently spread data in a random way across all storage devices. Such randomization of storage locations within the system while maintaining a very high level of performance is preferably achievable with storage media with a high random access speed; (2) A distributed storage architecture with separate control and data planes; Data mapping that maximizes write-endurance of storage media; System scalability; (3) System resiliency to fault and/or failure of any of its components; (4) Use of multi-technology media to maximize write-endurance of storage media; and (5) In-line deduplication in ultrahigh performance storage using electronic random-access storage media.

The examples described herein implement block storage in a distributed and scalable architecture, efficiently aggregating performance from a large number of ultra-fast storage media elements (SSDs or other), preferably with no performance bottlenecks, while providing in-line, highly granular block-level deduplication with no or little performance degradation.

One challenge is to avoid performance bottlenecks and allow performance scalability that is independent of user data access patterns.

The examples described herein may overcome the scalability challenge by providing data flow (Write, Read) that is distributed among an arbitrary and scalable number of physical and logical nodes. The distribution is implemented by (a) separating the control and data paths (the "C" and "D" modules), (b) maintaining optimal load balancing between all Data modules, based on the content of the blocks (through the CAS/hashing mechanisms), hence ensuring always balanced load sharing regardless of user access patterns, (c) maintaining optimal load balancing between all Control modules, based on the user address of the blocks at fine granularity, hence ensuring always balanced load sharing regardless of user access patterns, and (d) performing all internal data path operations using small granularity block size, hence detaching the incoming user access pattern from the internal access pattern, since the user pattern is generally larger than the block size.

A second challenge is to support inline, highly granular block level deduplication without degrading storage (read/write speed) performance. The result should be scalable in both capacity—which is deduplicated over the full capacity space—and performance.

The solution involves distributing computation-intensive tasks, such as calculating cryptographic hash values, among an arbitrary number of nodes. In addition, CAS metadata and its access may be distributed among an arbitrary number of nodes. Furthermore, data flow algorithms may partition read/write operations in an optimally-balanced way, over an arbitrary and scalable number of Nodes, while guaranteeing consistency and inline deduplication effect over the complete storage space.

In detaching the data from the incoming pattern, the R-Module breaks up any incoming block which is larger than the granularity size across sub-LUNs, sending the relevant parts to the appropriate C-Modules. Each C-module is predefined to handle a range or set of Sub-LUN logical addresses. The C-Module breaks up the block it receives for distribution to D-Modules, at a pre-determined granularity, which is the granularity for which a Hash is now calculated. Hence the end result is that a request to write a certain block (for example of size 64 KB) ends up being broken up into for example 16 internal writes, each write comprising a 4 KB block.

The specific numbers for granularity can be set based on various design tradeoffs, and the specific number used herein of 4 KB is merely an example. The broken down blocks are then distributed to the D modules in accordance with the corresponding hash values.

A further challenge is to address flash-based SSD write/erase cycle limitations, in which the devices have a lifetime dependent on the number of write/erase cycles.

The solution may involve Inline deduplication to avoid writing in all cases of duplicate data blocks. Secondly, content (hash) based mapping to different data modules and SSDs results in optimal wear-leveling, ensuring equal spread of write operations to all data modules and SSDs independently of the user data/address access patterns.

In the following a system is considered from a functional point of view. As described above with respect to FIG. 1, the system 10 is architected around four main functional Modules designated R (for Router), C (for Control), D (for Data), and H (for Hash). Being modular and scalable, any specific system configuration includes at least one of R, C, D, and H, but may include a multiplicity of any or all of these Modules.

Figure 2:
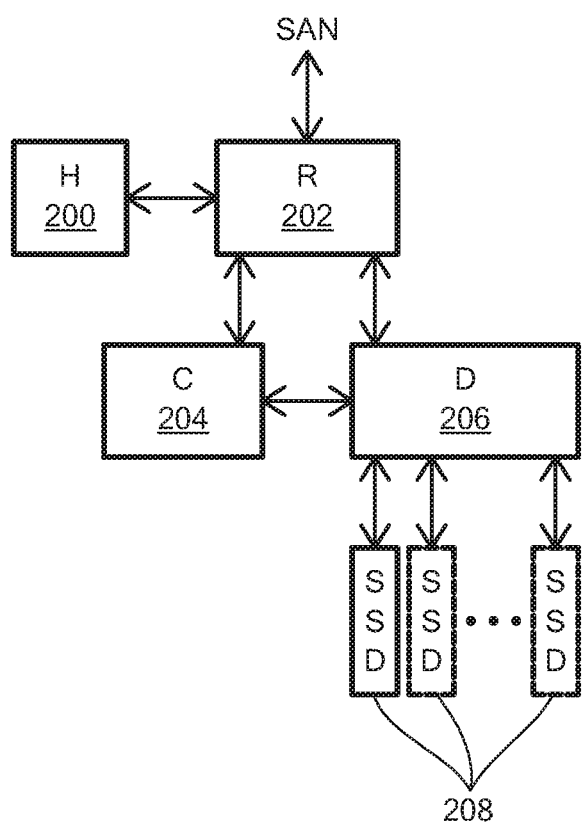
FIG. 2 shows an exemplary configuration of modules for the system of FIG. 1.

Reference is now made to FIG. 2, which is a functional block diagram of the system in which an H module 200 is connected to an R module 202. The R module is connected to both Control 204 and data 206 modules. The data module is connected to any number of memory devices SSD 208.

A function of the R Module 202 is to terminate SAN Read/Write commands and route them to appropriate C and D Modules for execution by these Modules. By doing so, the R Module can distribute workload over multiple C and D Modules, and at the same time create complete separation of the Control and Data planes, that is to say provide separate control and data paths.

A function of the C Module 204 is to control the execution of a Read/Write command, as well as other storage functions implemented by the system. It may maintain and manage key metadata elements.

A function of the D Module 206 is to perform the actual Read/Write operation by accessing the storage devices 208 (designated SSDs) attached to it. The D module 206 may maintain metadata related with the physical location of data blocks.

A function of the H Module is to calculate the Hash function value for a given block of data.

Figure 3:
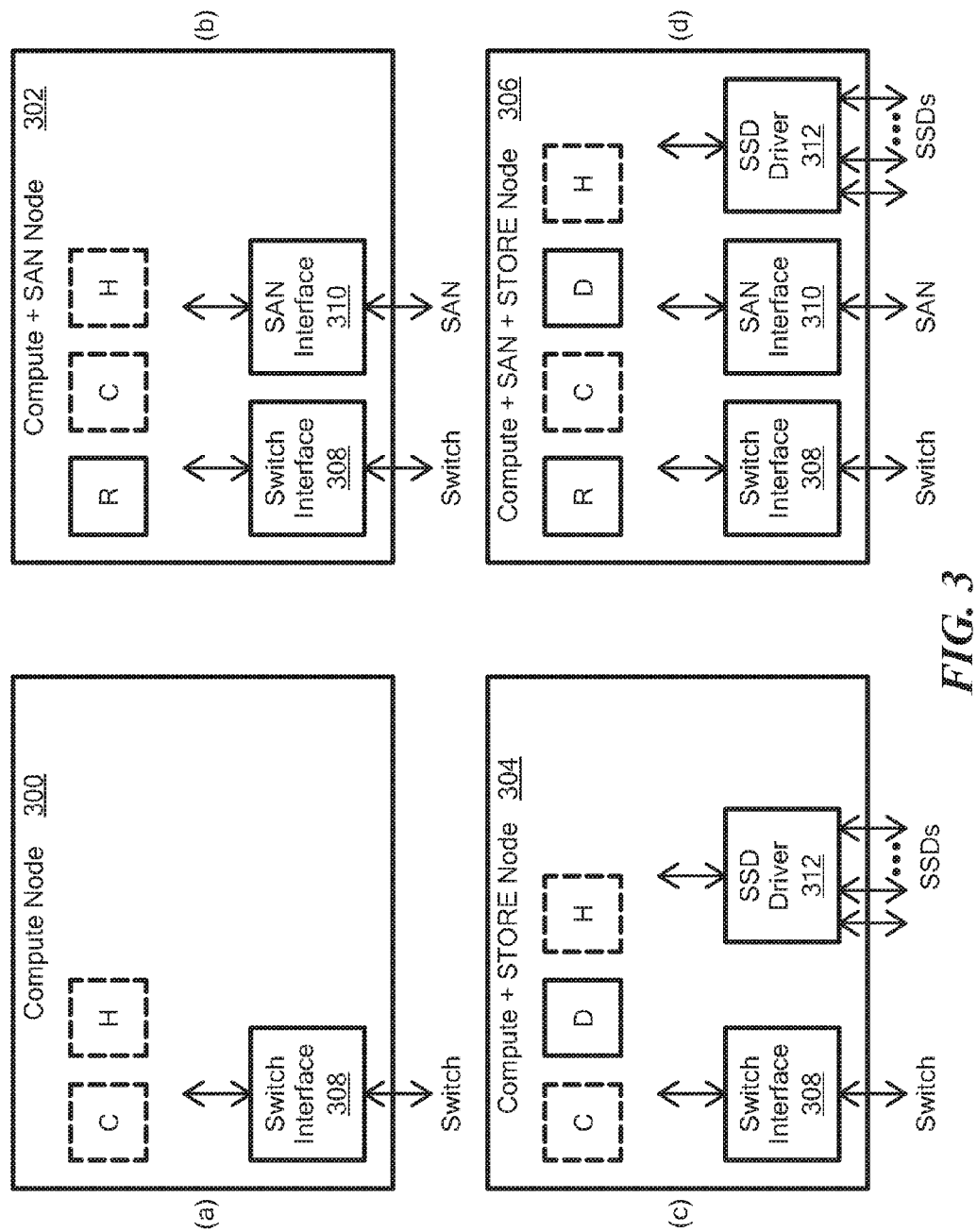
FIG. 3 is a simplified diagram schematically illustrating four different node configurations for the system.

Reference is now made to FIG. 3, which illustrates nodes. The R, C, D, and H Modules may be implemented in software, and executed on a physical Node. A system includes at least one physical Node, and may include multiple Nodes. There are four possible Node configurations: Compute Node 300, which includes control and hash modules, Compute+SAN Node 302 which includes a router as well as control and hash modules, Compute+Store Node 306, which includes a data module in addition to compute and hash modules, and a Compute+SAN+Store Node 306, which includes all four modules. A system includes a storage area networking or SAN function within at least one Node, and a Store function within at least one Node. The SAN function and the store function can be supported by the same physical Node or any combination of multiple Nodes.

In FIG. 3 each node type shows the functional Modules that execute, in at least one copy, within the Node, and functional Modules that may optionally execute within this Node. Optional Modules are shown in dashed line.

All Nodes include a switch interface 308, to allow interconnecting with a switch in a multi-Node system configuration. A Node that contains a SAN function includes at least one SAN Interface module 310 and at least one R Module. A Node that contains a Store function includes at least one SSD Driver Module 312 and at least one D Module. Hence, Compute+SAN and Compute+SAN+STORE Nodes contain a SAN Interface, to interface with the external SAN. The interface may typically use a SCSI-based protocol running on any of a number of interfaces including Fiber Channel, Ethernet, and others, through which Read/Write and other storage function commands are being sent to the system. Compute+Store and Compute+SAN+Store Nodes contain an SSD driver 312 to interface with SSDs 208 attached to that specific Node, where data is stored and accessed.

Figure 4:
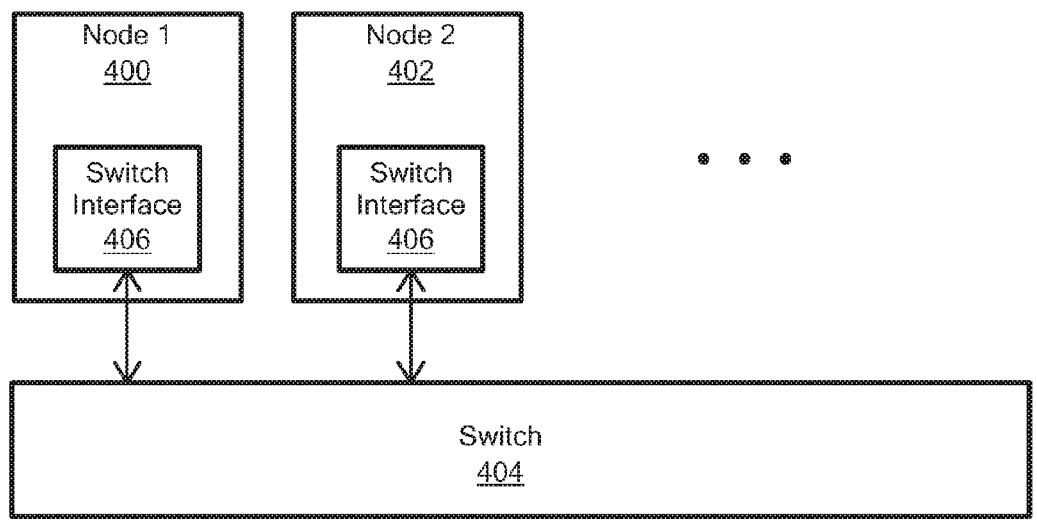
FIG. 4 is a simplified schematic diagram showing the nodes of FIG. 3 connected to a switch.

Reference is now made to FIG. 4, which shows a high level system block diagram. A system implementation includes one or more Nodes 400, 402. In all cases where a system contains more than two Nodes, all physical Nodes are interconnected by a switch 404 which may be based on any of a number of networking technologies including Ethernet, InfiniBand and so forth. In the specific case of a 2-Node system, the two Nodes can be interconnected directly without a need for a switch.

The interconnections between each Node and the Switch may include redundancy, so as to achieve high system availability with no single point of failure. In such a case, each Node may contain two or more Switch Interface modules 406, and the Switch may contain two or more ports per physical Node.

Figure 5:
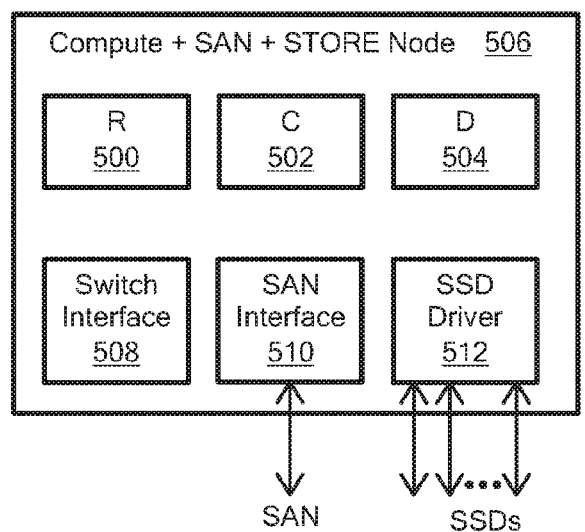
FIG. 5 is a simplified diagram showing a compute+SAN+store node for the device of FIG. 1.

As an example FIG. 5 illustrates a single Node system configuration, in which R, C and D modules, 500, 502 and 504 respectively are together in a compute+SAN+Store node 506. A switch interface 508 links to a switch. A SAN interface 510 provides an interface for storage area networking. An SSD driver 512 interfaces with the storage devices.

A four node system configuration is shown in FIG. 1 above. The configuration includes two compute and store nodes and two compute+SAN nodes.

A system that is built from multiple physical Nodes can inherently support a high availability construction, where there is no single point of failure. This means that any Node or sub-Node failure can be compensated for by redundant Nodes, having a complete copy of the system's meta-data, and a complete redundant copy of stored data (or parity information allowing recovery of stored data). The distributed and flexible architecture allows for seamless support of failure conditions by simply directing actions to alternate Nodes.

The R module is responsible for: routing SCSI I/O requests to the C modules, guarantee execution and return the result; and balancing the work load between the C modules for the requests it is routing.

An A→C table indicates which C module is responsible for each logical X-page address (LXA). Each C module is responsible for a list of Sub LUNs (SLs).

The R module receives requests for I/Os from the SAN INTERFACE, routes them to the designated C modules and returns the result to the SAN INTERFACE.

If an I/O operation spans across multiple SLs, and perhaps multiple C modules, then the R module has the responsibility of breaking the big I/O operation into multiple smaller independent operations according to the sub LUN unit size (SLUS). Since the atomic unit size (AUS) is never larger than the SLUS, as explained in greater detail below, each such I/O is treated as an independent operation throughout the system. The results may then be aggregated before returning to the SAN INTERFACE.

The R module is responsible for maintaining an up-to-date A→C table coordinated with the MBE. The A→C table is expected to balance the range of all possible LXAs between the available C modules.

For write operations, the R module instructs the calculation of the hash digest for each X-Page by requesting such calculation from a Hash calculation module.

The C module is responsible for: receiving an I/O request from an R module on a certain SL, guaranteeing its atomic execution and returning the result; communicating with D modules to execute the I/O requests; monitoring the disk content of its SLs' logical space by associating each LXA with its hash digest; and balancing the work load between the D modules for the SLs it is maintaining.

An H→D table maps each range of hash digests to the corresponding D module responsible for this range.

An A→H table maps each LXA that belongs to the SLs C is responsible for, to the hash digest representing the X-Page Data that currently resides in this address.

The C module receives I/O requests from R modules, distributes the work to the D modules, aggregates the results and guarantees an atomic operation. The result is returned to the R module.

The C module maintains an up-to-date H→D table coordinated with the MBE. The table is expected to balance the range of all possible hash digests between the available D modules.

The C module maintains an A→H table in a persistent way. The C module may initiate 110 requests to D modules in order to save table pages to disk, and read them from disk. To avoid frequent disk operations, a Journal of the latest table operations may be maintained.

Data is balanced between the C modules based on the logical address, at the granularity of sub-LUNs.

The D module is responsible for: maintaining a set of LUNs which are attached locally and performing all I/O operations on these LUN; managing the physical layout of the attached LUNs; managing the mapping between X-Page Data hash digests and their physical location in a persistent way; managing deduplication of X-Page Data in a persistent way; and receiving disk I/O requests from C modules, perform them and returning a result.

The D module is also responsible for, for each write operation, backing up the X-Page Data in the designated D backup module and performing read-modify operations for writes that are smaller than X-Page size (This process also involves computing a hash digest for these X-Pages).

The D module is further responsible for maintaining an up-to-date H→(D, $D_{backup}$) table coordinated with the MBE. The H→(D, $D_{backup}$) table is expected to balance the range of all possible hash digests between the available D modules.

The D module does not communicate directly with R modules. The only interaction with R modules involves RDMA read/write operations of X-Page Data.

Balancing between the D modules is based on hashing of the content.

The D module makes use of a hash digest metadata table. The hash digest metadata table maps each in use hash digest, that represents actual X-Page Data, to its meta data information including its physical page on the storage media (SSD), its memory copy (if exists), a mapping to any backup memory copy and a reference count for the purpose of deduplication.

A further structure used is the H→(D, $D_{backup}$) table. The H→(D, $D_{backup}$) table maps each range of hash digests to the corresponding D module responsible for the range as well as the $D_{backup}$ module responsible for the range.

The D modules allocate a physical page for each X-Page. The D modules also manage the memory for the physical storage. They allocate memory pages for read/write operations and perform background destaging from memory to storage media when necessary, for example, when running low on memory.

The D modules manage a separate nonvolatile memory pool (NVRAM or UPS protected) for X-Page Data backup purposes. The backup holds X-Pages that are held in memory of the D primary and have not yet been destaged. When re-balancing between D modules occurs (due to a D module failure for example), the D module may communicate with other D modules in order to create new backup copies or move a primary ownership as required.

The D modules allow deduplication per X-Page Data by maintaining a persistent reference count that guarantees only one copy per X-Page Data. The D modules manage the hash digest metadata table in a persistent way. The table is coordinated with the physical layout for physical pages allocation, with the memory pointer, memory backup pointer and deduplication reference count.

The D modules receive I/O requests from C modules, perform the requests while supporting deduplication and return the result. The D modules may perform RDMA read/write operations on memory that resides in other modules, such as R modules as mentioned above, as part of the I/O operation.

When a write operation smaller than the size of an X-Page is received, the D module may read the entire X-Page to memory and perform partial X-Page modification on that memory. In this case race conditions may occur, for example when two small writes to the same X-Page occur in parallel, and the D module may be required to compute the hash digest of the resulting X-Page. This is discussed in greater detail below.

The H-Module calculates the Hash function of a given block of data, effectively mapping an input value to a unique output value. The Hash function may be based on standards based hash functions such as SHA-1 and MD5, or based on a proprietary function. The hash function is selected to generate a uniformly distributed output over the range of potential input values.

The H modules usually share nodes with an R module but more generally, the H modules can reside in certain nodes, in all nodes, together with R modules, or together with C or D modules.

The following discussion provides high level I/O flows for read, write and trim.

Throughout these flows, unless noted otherwise, control commands are passed between modules using standard RPC messaging, while data "pull" operations may use RDMA read. Data push (as well as Journal) operations may use RDMA write.

The read flow of one X-Page may consist of one R module which receives the read request from the application, one C module in charge of the address requested and one D module which holds the X-Page to be read. Larger, or unaligned, requests may span several X-Pages and thus may involve several D modules. These requests may also span several SLs, in which case they may involve several C modules as well.

Figure 6:
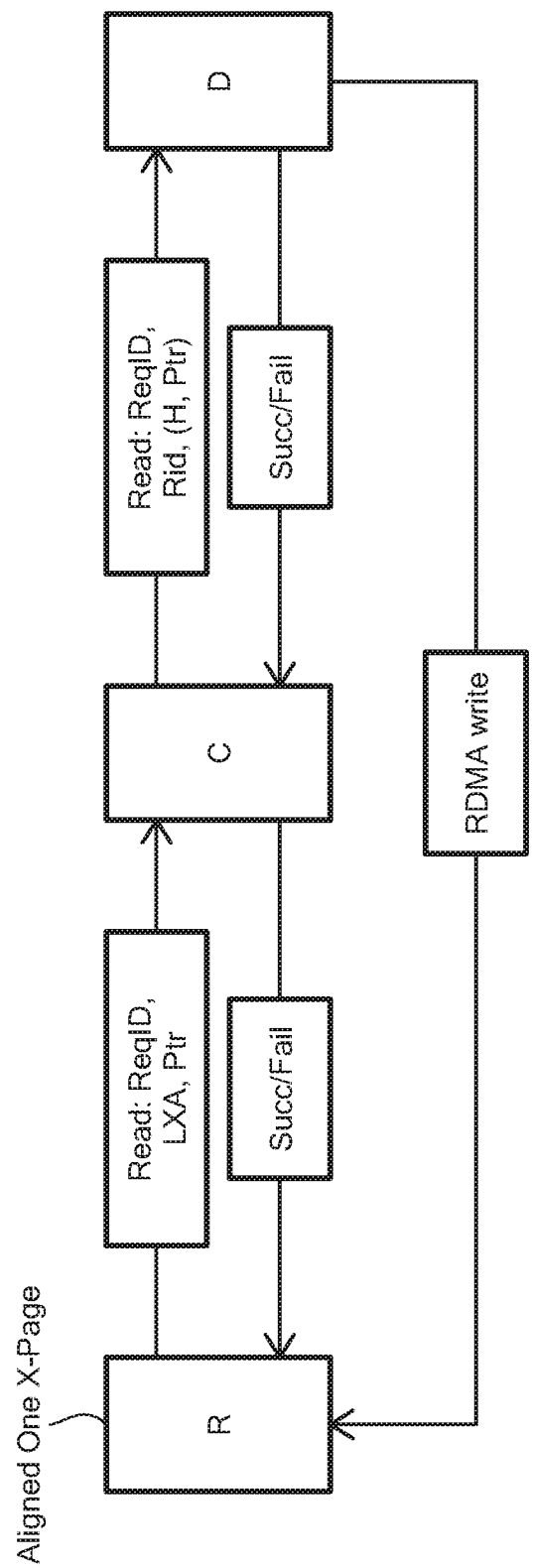
FIG. 6 is a simplified flow chart which illustrates the flow for a read operation for one aligned X-page.

Reference is now made to FIG. 6 which illustrates the flow for a read operation for one aligned X-page. When the R module receives a read request from an application the R module allocates a request ID for the operation; translates the LBA to LXA; allocates a buffer for the data to be read; consults the A→C component to determine which C module is in charge of this LXA; and sends the designated C module a read request which includes parameters that include a request ID; an LXA; and a pointer to the allocated buffer.

The C module, when receiving the request, consults the A→H component, from which it obtains a hash digest representing the X-Page to be read; consults the H→D component to determine which D module holds the X-Page in question; and sends this D module a read request which includes parameters that include a request ID (as received from the R module), the hash digest, a pointer to the buffer to read to, as received from the R module; and an identifier of the R module.

The D module, when receiving the request, reads the data of the requested X-Page from SSD and performs an RDMA write to the requesting R module, specifically to the pointer passed to it by the C module.

Finally the D module returns success or error to the requesting C module.

The C module in turn propagates success or error back to the requesting R module, which may then propagate it further to answer the application.

Figure 7:
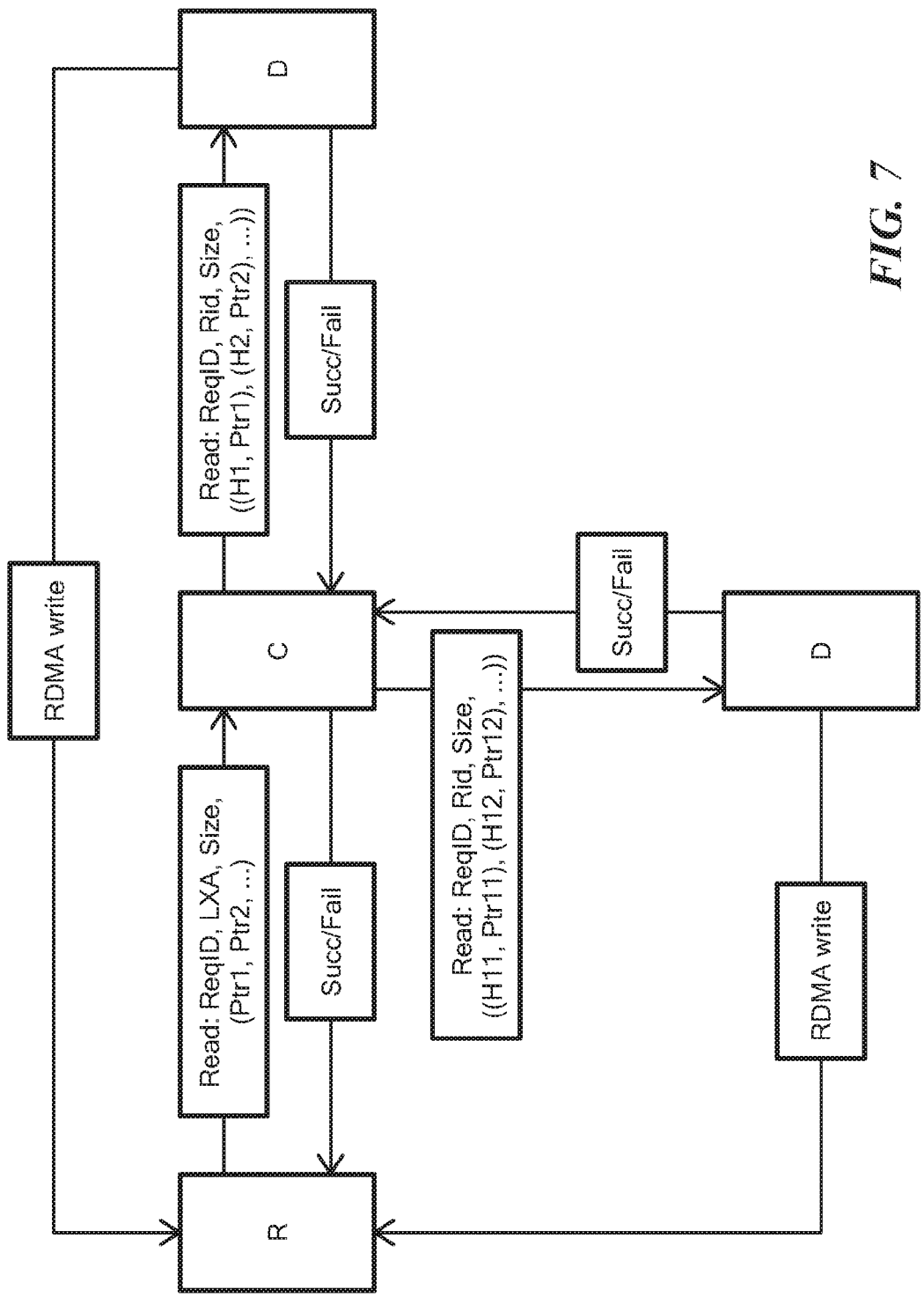
FIG. 7 is a simplified flow chart which illustrates the flow in the event that a read request arrives for a range of addresses spanning more than one X-Page but only one SL.

Reference is now made to FIG. 7, which illustrates the flow in the case that a read request arrives for a range of addresses spanning more than one X-Page but only one SL. In such a case the R module sends the designated C module a read command with the parameters that include a request ID, first LXA, size of the requested read in X-Pages-n, and n pointers to the allocated X-Page buffers.

The rest of the R module's treatment is identical to the aligned one X-Page scenario previously described herein.

The C module, when receiving the request divides the logical address space to LXAs. For each LXA the C module consults the A→H component to determine the corresponding hash digest; consults the H→D table to determine which D module is responsible for the current LXA; sends each D module a read command containing all the hashes that the respective D module is responsible for. The parameters of the read command include a request ID (as received from the R module); a list of respective hash-pointer pairs; and the identifier of the R module.

Each D module, when receiving the request, acts per hash-pointer pair in the same manner as described above for one X-Page. Aggregated success or error is then sent to the requesting C module.

The C module aggregates all the results given to it by the D modules and return success or error back to the requesting R module, which may then answer the application.

In the case that a read request spans multiple SLs, the R module splits the request and sends several C modules read requests. Each C module may receive one request per SL. The flow may continue as in the simpler case above, except that now the R module aggregates the responses before it answers the application.

Read requests smaller than 4 KB, as well as requests not aligned to 4 KB, may be dealt with at the R module level. For each such parcel of data, the R module may request to read the encompassing X-Page. Upon successful completion of the read command, the R module may crop the non-relevant sections and return only the requested data to the application.

The write flow of one X-Page may consist of one R module which receives the write request from the application, one C module in charge of the address requested and three D modules: $D_{target}$ which is in charge of the X-Page Data to be written (according to its appropriate hash digest), $D_{old}$ which was in charge of the X-Page Data this address contained previously ("old" hash digest), and $D_{backup}$ in charge of storing a backup copy of the X-Page Data to be written.

Figure 8:
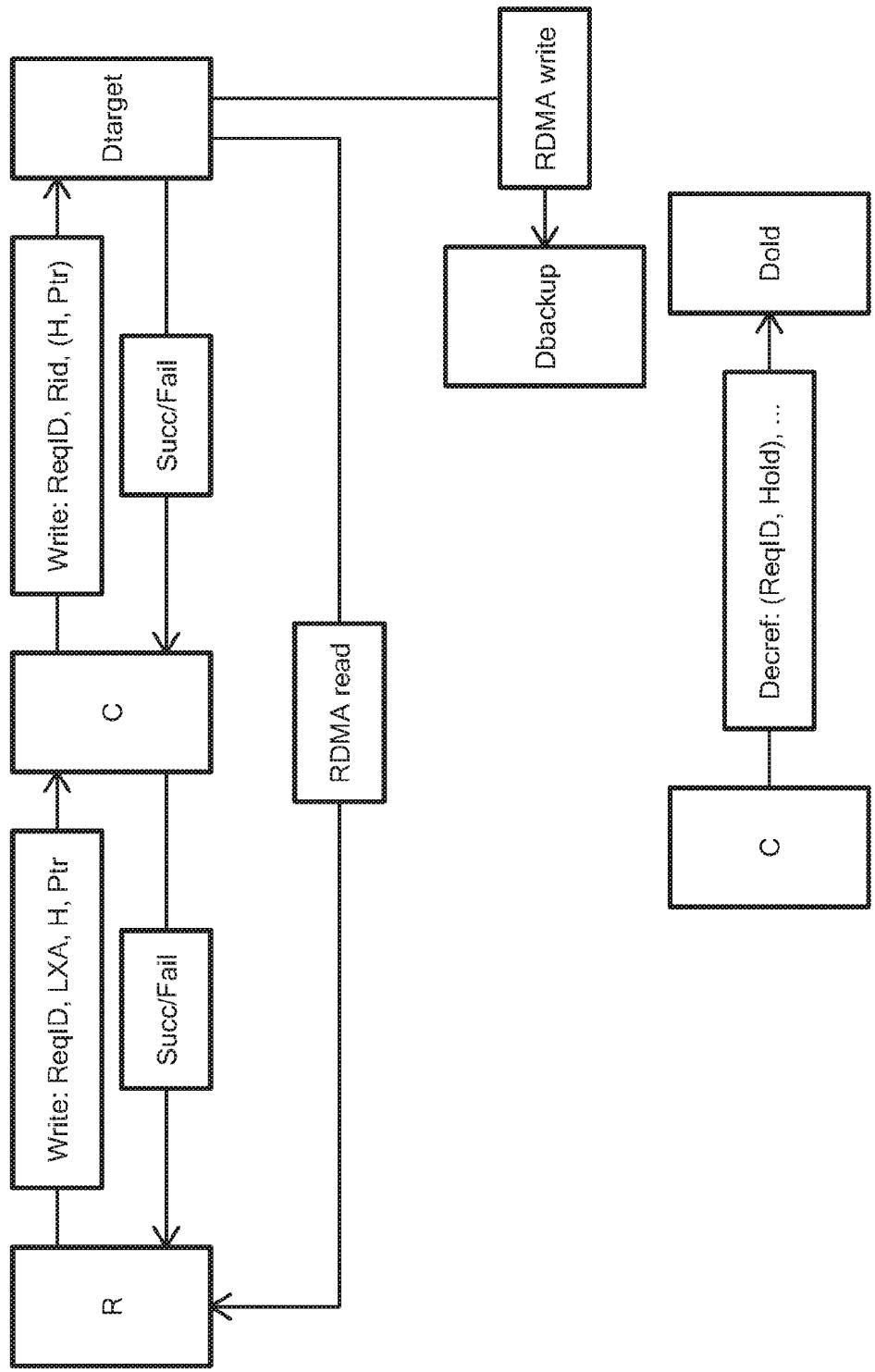
FIG. 8 is a simplified flow diagram illustrating the write procedure for a single aligned X page.

Reference is now made to FIG. 8, which is a simplified flow diagram illustrating the write procedure for a single aligned X page according to the examples described herein.

When an R module receives a write request from the application, the R module allocates a request ID for this operation; translates the LBA to an LXA; computes a hash digest on the data to be written; consults its A→C component to determine which C module is in charge of the current LXA; and sends the designated C module a write command with parameters that include a request ID; an LXA; a hash digest; and a pointer to the buffer containing the data to be written.

The C module, when receiving the request consults its H→D component to understand which D module is in charge of the X-Page to be written ($D_{target}$); and sends $D_{target}$ a write request with parameters that include the request ID (as received from the R module); the hash digest (as received from the R module); the pointer to the data to write (as received from the R module); and the identifier of the R module.

The D module receiving the write command, $D_{target}$, may first check if it already holds an X-Page corresponding to this hash. There are two options here:

First, $D_{target}$ does not have the X-Page. In this case $D_{target}$ fetches the data from the R module using RDMA read and stores it in its memory; consults the H→D component to determine which D module is in charge of storing a backup copy of this X-Page ($D_{backup}$); performs an RDMA write of the X-Page Data to the $D_{backup}$ backup memory space; and returns success (or failure) to the C module.

Second, $D_{target}$ has the X-Page. In this case $D_{target}$ increases the reference count, returns success (or failure) to the C module.

The C module waits for a response from $D_{target}$. If a success is returned, the C module updates the A→H table to indicate that the LXA in question should point to the new hash and returns a response to the requesting R module.

If this is not a new entry in the A→H table, the C module asynchronously sends a decrease reference count command to $D_{old}$ (the D module responsible for the hash digest of the previous X-Page Data). These commands may be aggregated at the C module and sent to the D modules in batches.

The R module may answer the application once it receives a response from the C module.

Figure 9:
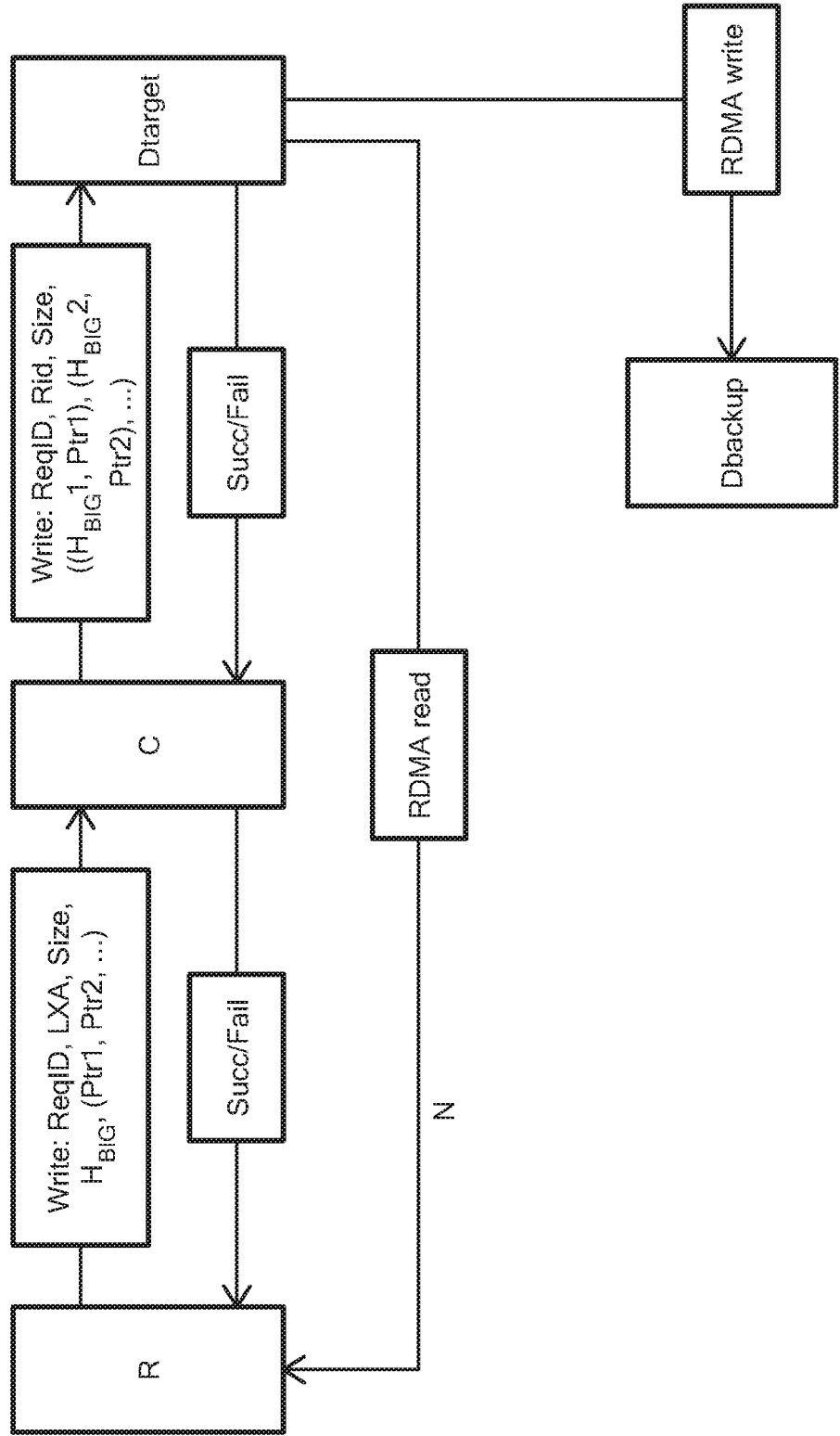
FIG. 9 is a simplified flow diagram illustrating the process for performing write operations to multiple full X-Pages.

Reference is now made to FIG. 9, which is a flow diagram illustrating the process for writes to multiple full X-Pages.

In the case that the write request spans a range of addresses which include more than one X-Page but only one SL, the R module sends the designated C module a write command with parameters that include a request ID; a first LXA; a size of the requested write in LXAs-n; and $H_{BIG}$ which is a unique identifier of the entire chunk of data to be written. $H_{BIG}$ may be a computed hash digest and thus equal for two identical chunks of data.

Additional parameters sent with the write command are n pointers that point to the buffers which hold the data to be written.

The rest of the R module treatment is the same as for the aligned one X-Page scenario.

The C module, when receiving the request, consults its H→D component to understand which D module is in charge of $H_{BIG}$ ($D_{target}$) and generates a hash digest per pointer by replacing one byte of $H_{BIG}$ with the offset of that pointer. It is noted that this byte must not collide with the bytes used by the H→D table distribution.

It may send $D_{target}$ a write request with the parameters that include the request ID (as received from the R module); a list of respective hash-pointer pairs; and the Identifier of the R module.

The D module, when receiving the request, acts per hash-pointer pair in the same manner as described above for one X-Page. Aggregated success or error is then sent to the requesting C module.

The C module waits for a response from $D_{target}$. If the response indicates success, the C module updates its A→H table to indicate that the LXAs in question should point to the new hashes. Updating of entries in the A→H table may be done as an atomic operation, to ensure the write request is atomic. Note that all requests aligned to 4 KB (or another predefined block size) that fall within a SL may be atomic. The C module returns a response to the requesting R module. The C module adds the list of old hashes to the "decrease reference" batch if needed.

The R module answers the application once it receives a response from the C module.

In the case in which a write request spans multiple SLs, the R module splits the request and sends smaller write requests to several C modules. Each C module receives one request per SL (with a unique request ID). The flow continues as in the simpler case above, except that now the R module aggregates the responses before it answers the application.

Figure 10:
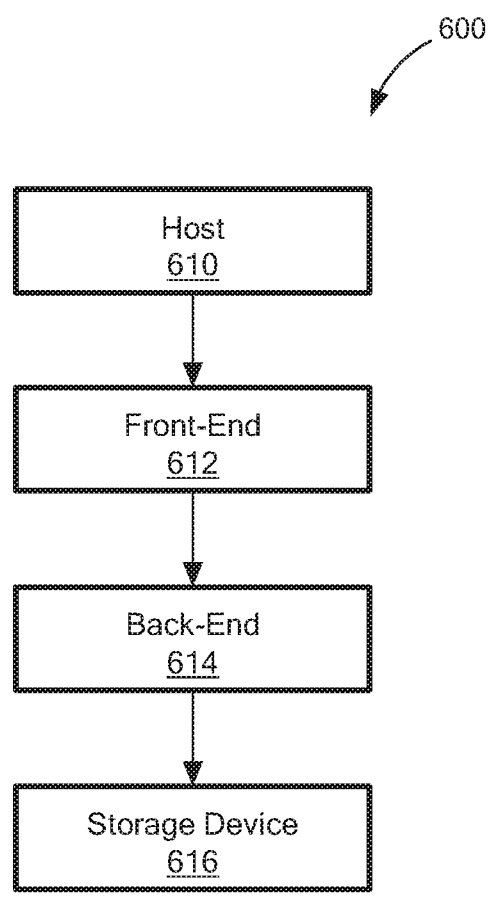
FIG. 10 is a block diagram of a system to perform data reduction.

Referring to FIG. 10, a system 600 includes a host 610, a front-end 612, a back-end 614 and a storage device 616. The front-end 612 includes, for example, a controller, a router, ports connecting the system 600 to one or more servers such as Fibre Channel or iSCSI ports, and so forth. The back-end 614 includes, for example, flash drives or flash memory used to store data, data controllers used for managing data on the drives including data protections algorithms such as RAID-5 or RAID-6. The back-end storage 616 is, for example, a SSD. In one example, the back-end storage 616 is flash-based.

Figure 11:
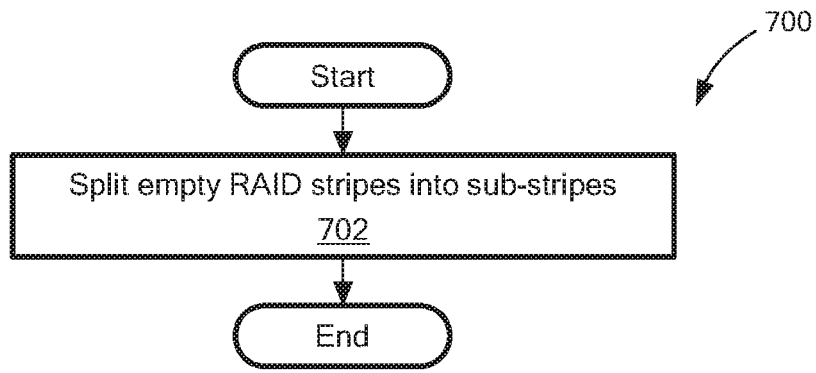
FIG. 11 is a flowchart of an example of a process to prepare for data compression.

Referring to FIG. 11, one example of a process to prepare for data compression is a process 700. Process 700 splits empty RAID (redundant array of independent disks) stripes into sub-stripes (702). In a RAID system, the backend 614 manages RAID stripes. Using an example of having 4 KB pages, each stripe is composed of N pages of data and K pages of parity, consuming a total of 4*(N+K) KB of Flash storage, where K>1 and N>1 and N equals the number of disks minus K; and K in one example equals 2. These stripes are called "1-stripes". The 1-stripes are split into variable size sub-stripes, where the width of a sub-stripe divides the page size. For example, a 2-stripe may include 2N+2K sub-pages of 2 KB. This can be performed by taking normal stripes (i.e., 1-stripes) and splitting them horizontally, resulting in twice as many 2 KB sub-pages. Similarly, a 4-stripe includes 4N+4K sub-pages of 1 KB and an 8-stripe includes 8N+8K sub-pages of 512B. S-stripes with S=1, 2, 4, 8, for example, consume the same amount of Flash storage, and thus there is no unusable small pieces of space on disk that cannot be reused. Also, any type of stripe (e.g., 2-Stripe, 3-Stripe and so forth) can be converted to another type of S-stripe in place, as needed.

Figure 12:
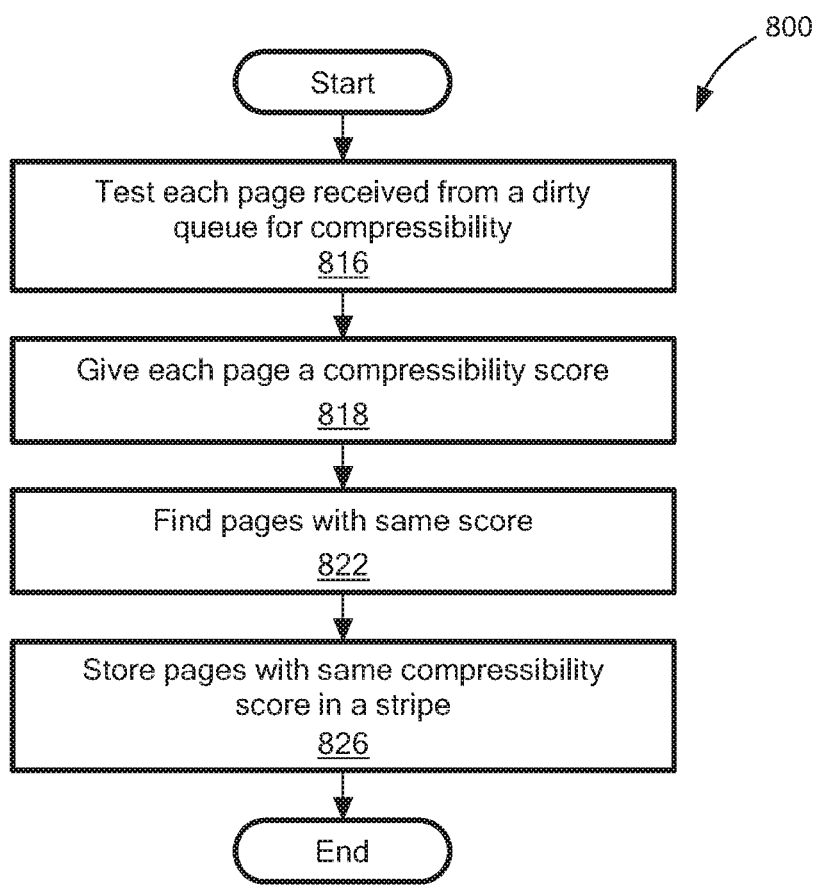
FIG. 12 is a flowchart of an example of a process to compress data.

Referring to FIG. 12, process 800 scans pages from a dirty queue, i.e., pages that have data that needs to be written to disk, and tests each page for compressibility (816). Process 800 gives each page a score of 1, 2, 4, 8 and so forth (818). A score of S means that the compressed page fits into a sub-page of 4 KB divided by S. For example, a page compressible by 80% gets a score S=4 (fits into ¼ of a normal 4 KB page.)

Process 800 finds S*N pages with a score S (822) and stores the pages into a corresponding S-stripe (826). When data is read from a compressed sub-page, it is uncompressed on the fly. Consider for example a 64 KB read command. This command triggers 16 page read operations (each of 4 KB). If the data is compressed, the array will decompress 16 pages. However, unlike other systems, the decompress operations can be run in parallel. For example, in a large cluster it is likely that the 16 pages are processed by different CPUs or different threads in multi-core CPUs, and the 16 decompress operations will happen simultaneously. This effectively improves the performance of decompress by a factor of 16, and instead of a high penalty on the 64 KB read there is very little if any penalty.

Processes 700 and 800 change the behavior of the back-end 614. Every page received is compressed, but existing stripes are not split.

Figure 13:
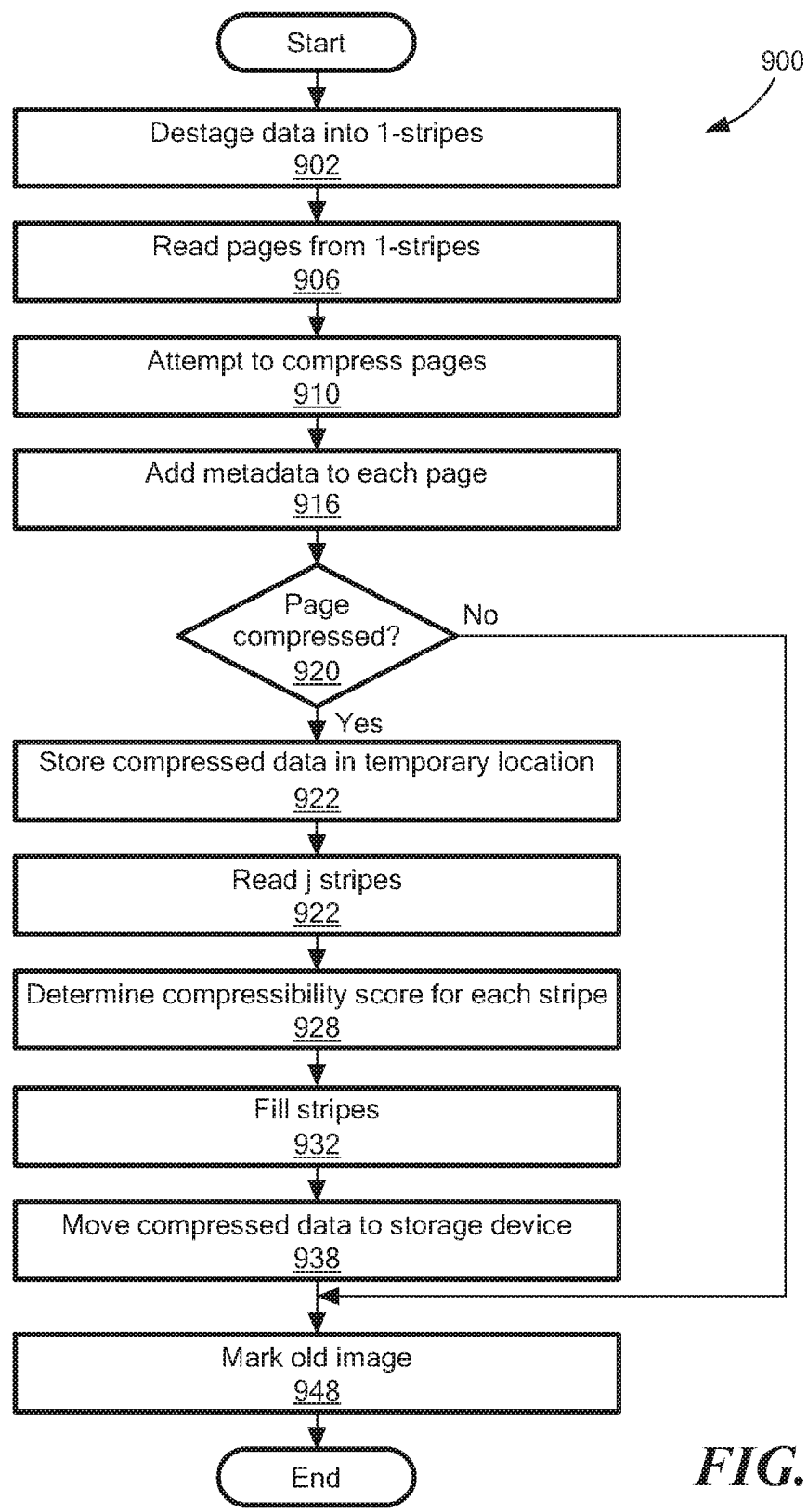
FIG. 13 is a flowchart of another example of a process to compress data.

Referring to FIG. 13, a further example of a process to compress data is a process 900. In one example, process 900 is a background process that is controlled by management software and runs only when the system has sufficient resources (for example, when CPU resources are plentiful or when disk space is severely limited). Process 900 is similar to the process 800 except that process 900 does not require online compression of data. For example, the data is saved at the storage device 616 uncompressed and process 900 compresses the data and the data is returned to storage device 616 compressed.

Process 900 destages data into 1-stripes (902). For example, user write operations result in the normal destaging of data into 1-stripes, where destaging is the writing of the data to the disks (e.g., writing data from 614 to 616).

Process 900 reads pages from the 1-stripes (906) and attempts to compress the pages (910). Process 900 adds metadata to each page (916). For example, the metadata may include one or more of the following: an indicator of whether the page is compressed or not; an indicator of what method was used to compress the page; one or more indicators indicating compression method attempted.

Process 900 determines if the page was compressed (920). For example, the process 900 reads the metadata added in processing block 916.

Process 900 stores compressed data in a temporary location (922), reads j 1-stripes (e.g., 100), determines the compressibility score of each of pages in the stripes (928) and fills the stripes (i.e., write the compressed pages to the stripes corresponding to their compression level) (938). j is greater than or equal to 1. In one particular example, j=100 so that there are 100*N pages with different scores. In one example, process 900 first tries to fill as many 8-stripes as possible (i.e., it looks for 8N pages with a score greater than or equal to 8). Then it tries to fill as many 4-stripes as possible (looking for 4N pages of score greater than or equal to 4). Then it tries to fill as many 2-stripes as possible (looking for 2N pages of score greater than or equal to 2). The remainder of the pages is stored in 1-stripes (i.e., no compression).

While it is unlikely that all the pages in a 1-stripe will have the same score, the old 1-stripes cannot be dismantled. However, if the stripes could be moved to an S-Stripe they could be dismantled. For example, processing block 702 may be used to break the 1-stripe into sub-stripes. Similarly, multiple adjacent empty sub-stripes may be combined into an empty 1-stripe.

Process 900 marks the old image (948). For example, the old image remains in place in the 1-Stripe with an indication (indicator) that it participates in the stripe but is unused. Eventually, these unused pages will be overwritten (in a similar way that pages with ref-count=0 eventually get overwritten.). Process 900 is ideal when the system resources are limited and, in particular, if a write cache is limited. Process 900 enables the system 600 to service I/Os as fast as possible during high activity, and compresses the data when activity is low.

Any of the processes described herein may be further modified. The data will be kept in the system's data cache uncompressed. Once the data reaches the persistent uncompressed data cache the write is acknowledge to the user (thus avoiding the latency penalty introduced by the compression of data for write.) The uncompressed cache acts as a queue for a background compression process, which attempts to compress all the pages and place the compressed data into the correct compressed queue of pages. These queues will act as inputs for regular destaging processes, while the original uncompressed data will be kept persistently in the cache. Once the destage process is over, the uncompressed data serves as regular cached data and we remove the compressed data from the queue. There are separate queues for some set types of data size (for instance <1K, <2K, 4K—compression scores of 4, 2, 1).

In another modification, additional types of queues may be introduced: for example, a queue for a different compression level (such as <3K—compression score 1.5). In another modification, other types of destaging scheme are introduced, for example: destaging one 1K and one 3K page to a single 4K page on disk). To add these modifications, another queue is added.

A significant benefit of this approach is that since the cache remains uncompressed, a read operation that results in a cache hit does not have a decompression latency penalty either, which is crucial for performance of applications that verify the data on write (like databases) or data hotspots.

Another benefit of this approach is that compression does not become the system's bottleneck. This is done by monitoring the state of the compression queue. Once the queue overfills a background process is introduced that destages pages immediately from the queue uncompressed, and writes them to normal 4K stripes. These pages are marked in the physical layout as uncompressed-compressible. Once the high load is over, an additional process evicts these pages to the persistent compression queue, where they are compressed in the same manner new data would have been compressed (or written as uncompressed-uncompressible if they can't be compressed). These two separate states: uncompressed-compressible and uncompressed-uncompressible allows an ability to differentiate between pages that are uncompressed since time was not available before to compress them, and pages that are uncompressed since an attempt was made to compress them and found out that they were not significantly compressible. This enables an ability to skip the latter kind of pages in the background compression algorithm (and not to repeatedly try to compress them only to fail every time.)

Figure 14:
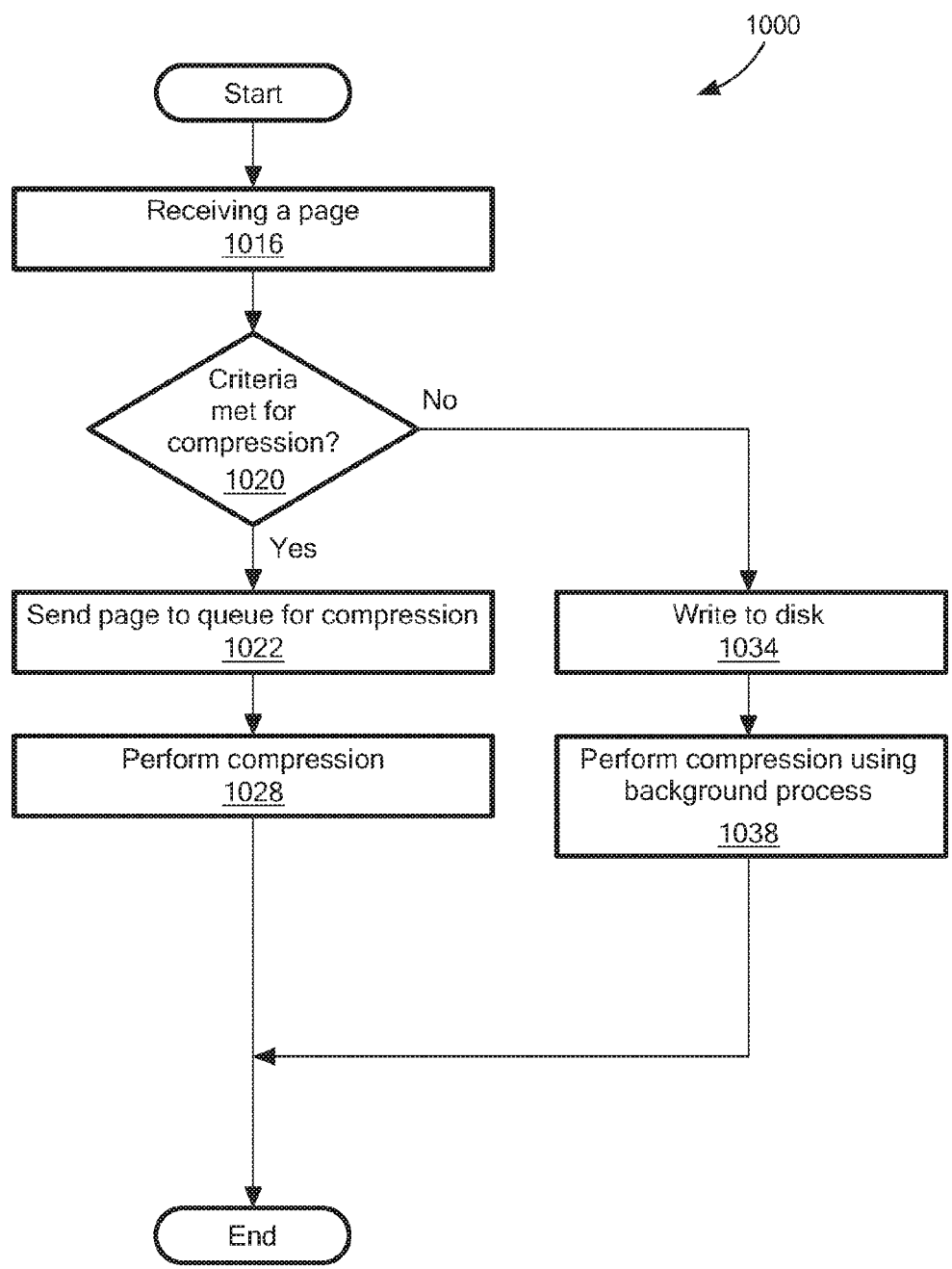
FIG. 14 is a flowchart of a further example of a process to compress data.

Referring to FIG. 14, an example of a process to perform compression is a process 1000. Process 1000 receives a page (1016) and determines if criteria are met for compression (e.g., CPU resources are available or the disk space falls below threshold) (1020). If the compression criteria are met, process 1000 sends the page to a queue for compression (1022) and compression is performed (1028) using a process 800, for example. If the compression criteria are not met, process 1000 writes the page to disk (1034) and compression is performed (1028) using a background process such as process 900, for example.

Another enhancement over the previous methods is a method for dynamically assigning stripes of different width (1, 2, 4, 8 and so forth). A pre-defined division would not work since it is not certain, a-priori, of the amount of pages having different compression scores. Therefore, one may be tempted to use a greedy algorithm—i.e., having all the stripes defined as unassigned and finding the emptiest stripes of our type and writing to the pages currently free, or if none are found, picking an unassigned stripe and assigning it to the needed type. For example, if all data is written to the array that has a score of 4, i.e., all the stripes assigned as 1K stripes are full. Once the array is full, half of the data is deleted in such a pattern that only the odd physical addresses become free. In this situation—on the one hand the array is 50% free, yet on the other hand there is no ability to write even a single uncompressible page, since there is not a single continuous page of length 4K. To solve this, a background defragmentation process may be introduced. This process continuously takes the emptiest stripes of each compression level and attempts to consolidate as many of these stripes into one full stripe. The freed up stripes are returned to the pool of unassigned of stripes, where they can be assigned to any other type. Counters are kept on the amount of available stripes of each size, including a counter for the number of unassigned stripes. This process runs only when any of these counters are low.

Compression allows a data-verification method. A read flow involves compressed data: (1) host sends a read request; (2) front-end translates it to a list of pages that need to be read; (3) back-end RAID creates a list of compressed pages that need to be read and uncompressed; (4) back-end decompresses these pages into the system's cache; (5) back-end transmit data to front-end. Assume that some of the pages were written to the media (Flash, Disk) with an undetectable media error, and are now corrupt. It is highly unlikely that a corrupt compressed page can be decompressed with no error. The data-verification method is used verify data integrity. If a page is found that cannot be decompressed, the RAID system declares this page as being corrupt, and uses the normal RAID mechanisms to rebuild it (from a mirror or from a parity). Once the page is rebuilt, the corrupt page is fixed and the correct data is returned to the user. If the rebuild fails (for example, if other pages required for the rebuild are corrupt as well), an error is returned to the user. Still, this is better than sending bogus data (to avoid a silent data corruption).

Figure 15:
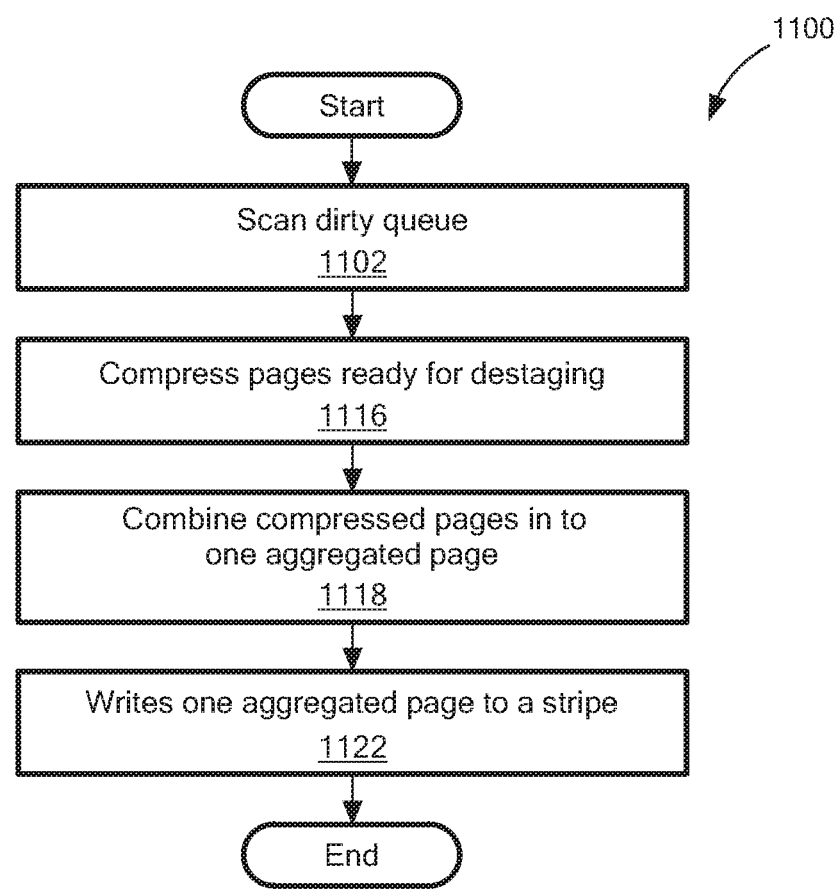
FIG. 15 is a flowchart of a still further example of a process to compress data.

Referring to FIG. 15, a still further example of a process to compress data is a process 1100. Process 1100 compresses data in a system cache which includes a dirty queue. A dirty queue is a queue or list of pages that needs to be destaged to disk. Every page will include a compression ratio. A compression ratio of 8 means the compression is performed at a factor of 8. Thus, 4 kB will be compressed to 512$b$. Neither the front-end 612 nor backend 614 (e.g., RAID stripes manager) are aware of compression performed by process 1100.

Process 1100 scans volatile "dirty queue" (1102) and compress pages ready for destaging (1116) according to the regular system policy, for example. Process 1100 combines compressed pages into one aggregated page (1118) and writes the one aggregated page to a stripe (1122). For example, multiple compressed pages are combined into one aggregated 4 KB page and the 4 KB page is written to a regular 4 KB stripe. The multiple compressed pages are called "sub-pages". Sub-pages can be of different size. An aggregated page contains fixed length header, describing offsets and sizes of all compressed pages included the aggregated page. The page address includes a field for the physical RAID 4 KB page as well as an index to the sub-page. Process 1100 is completely flexible and it is not limited by any assumption about cells borders. In other words, unlike other methods which pack together similar sub-pages (i.e., only pages compressible to <2 KB size, or only pages compressible to <1 KB size), process 1100 allows packing together pages of different compressibility. For example, it is possible to pack together one page that fits in 3 KB with two pages that each fit in 200B, into a total of a single 4 KB page with 3 sub-pages.

In process 1100 a fairly large queue of dirty pages is maintained. Normally, this queue has at least a few thousands pages. For each of these pages the compressibility score is determined, similar to other methods described herein. A standard packing algorithm selects pages that may be combined into an aggregated page in the most efficient way. Moreover, if process 1100 does not find any matching pages for some compressed page, this page may be just left in the dirty queue until the next time a destaging cycle is run. It should be noted that process 1100 provides more efficient utilization of the RAID pages than all the methods described herein. Additional benefit is that process 1100 avoids changes to the front-end or the back-end code.

In a modification to process 1100 data is kept compressed in cache, thus extending the effective size of the cache. For example, a cache that may contain up to 1100 uncompressed pages, can contain a few thousands of compressed pages. This improves Read and Write performance: Read hit is improved since we can store more pages in cache, and write performance is improved since the write cache can maintain more pages before it needs to slow down writes to the speed of the disk. Also, it may be beneficial to transmit compressed data over the internal network and decompress it on the way to the host.

Figure 16:
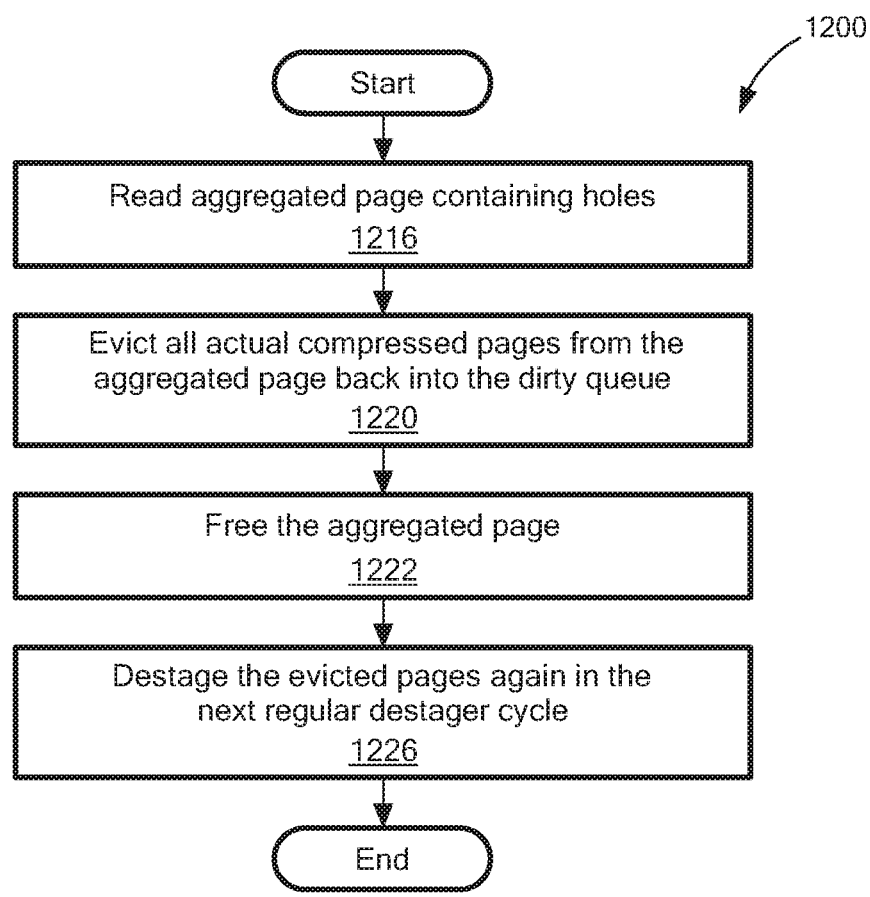
FIG. 16 is an example of a process to perform defragmentation.

Referring to FIG. 16, an example of a process to perform defragmentation is a process 1200. Deleting a page creates a hole in the aggregated page containing it. Process 1200 addresses this by (reading an aggregated page containing the holes (1216), evicting compressed pages from the aggregated page containing the holes back into the dirty queue (1220), freeing the aggregated page (1222), and destaging all the evicted pages again in the next regular destager cycle (1226). The process 1200 utilizes CPU and other system resources at low peak hours, when the resources are underutilized anyway.

Figure 17:
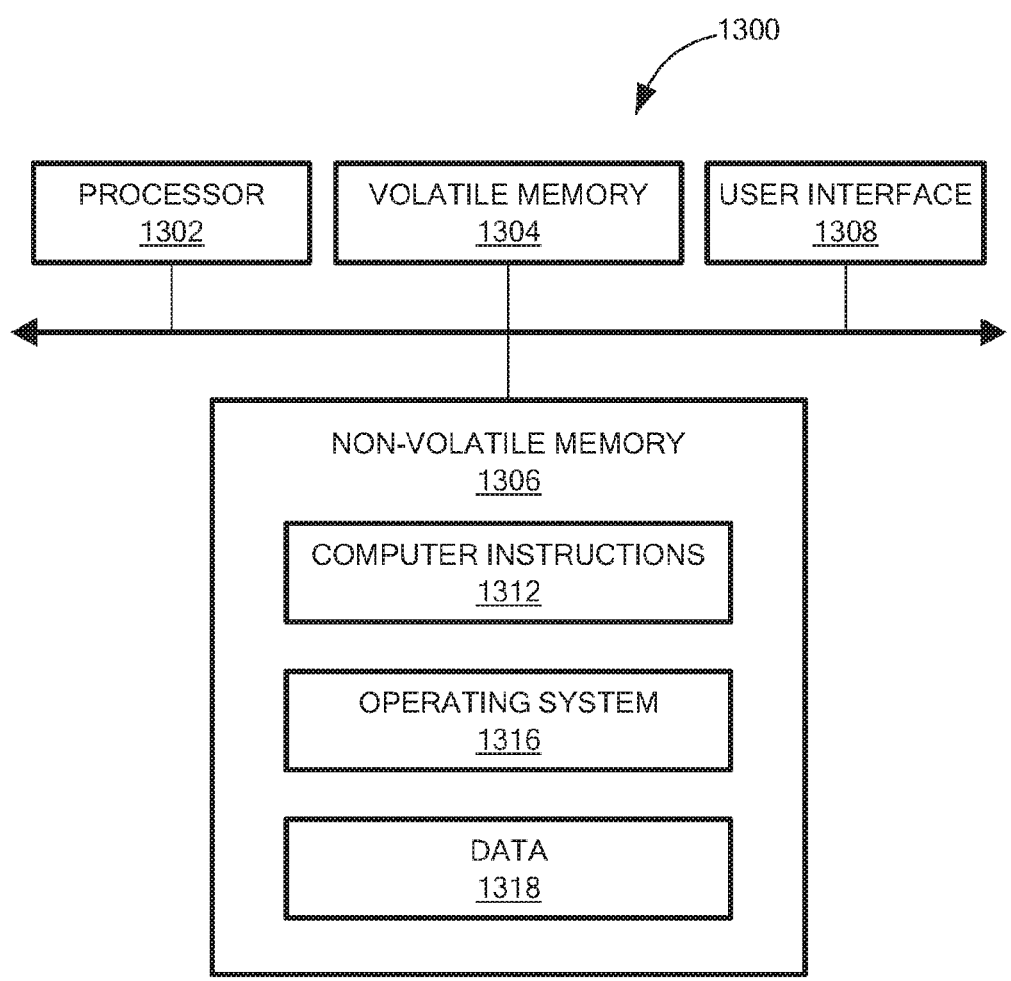
FIG. 17 is a computer on which all or part of the processes of FIGS. 11 to 16 may be implemented.

Referring to FIG. 17, in one example, a computer 1300 includes a processor 1302, a volatile memory 1304, a non-volatile memory 1306 (e.g., hard disk) and the user interface (UI) 1308 (e.g., a graphical user interface, a mouse, a keyboard, a display, touch screen and so forth). The non-volatile memory 1306 stores computer instructions 1312, an operating system 1316 and data 1318. In one example, the computer instructions 1312 are executed by the processor 1302 out of volatile memory 1304 to perform all or part of the processes described herein (e.g., processes 700, 800, 900, 1000, 1100 and 1200).

The processes described herein (e.g., processes 700, 800, 900 and 1000) are not limited to use with the hardware and software of FIG. 17; they may find applicability in any computing or processing environment and with any type of machine or set of machines that is capable of running a computer program. The processes described herein may be implemented in hardware, software, or a combination of the two. The processes described herein may be implemented in computer programs executed on programmable computers/machines that each includes a processor, a non-transitory machine-readable medium or other article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers)). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se.

The processes described herein are not limited to the specific examples described. For example, the processes 700, 800, 900, 1000, 1100 and 1200 are not limited to the specific processing order of FIGS. 11 to 16, respectively. Rather, any of the processing blocks of FIGS. 11 to 16 may be re-ordered, combined or removed, performed in parallel or in serial, as necessary, to achieve the results set forth above.

The processing blocks (for example, in the processes 700, 800, 900, 1000, 1100 and 1200) associated with implementing the system may be performed by one or more programmable processors executing one or more computer programs to perform the functions of the system. All or part of the system may be implemented as, special purpose logic circuitry (e.g., an FPGA (field-programmable gate array) and/or an ASIC (application-specific integrated circuit)). All or part of the system may be implemented using electronic hardware circuitry that include electronic devices such as, for example, at least one of a processor, a memory, a programmable logic device or a logic gate.

Elements of different embodiments described herein may be combined to form other embodiments not specifically set forth above. Other embodiments not specifically described herein are also within the scope of the following claims.

What is claimed is:

1. A method, comprising:
reading pages from 1-stripes, wherein 1-stripes are not compressed;
storing compressed data in a temporary location;
reading j 1-stripes, where j is greater than or equal to one;
determining compressibility score, S, for each 1-stripe of j stripes; and
filling S-stripes based on the compressibility score by writing compressed pages to S-stripes corresponding to the compressibility score, S, comprising:
filling 8-stripes before 4-stripes if 8-stripes exist by locating 8N pages with a score greater than or equal to 8;
filling 4-stripes before 2-stripes if 4-stripes exits by locating 4N pages with a score greater than or equal to 4;
filling 2-stripes before 1-stripes if 2-stripes exist by locating 2N pages with a score greater than or equal to 2,
wherein N>1 and N equals the number of disks minus K, and K is the number of parity disks where K>1.

2. The method of claim 1, further comprising:
storing in the system's data cache uncompressed; and
after the data reaches the persistent uncompressed data cache; acknowledging the write to a user.

3. The method of claim 1, further comprising adding a queue for each compressibility score.

4. The method of claim 1, further comprising:
adding a queue; and destaging smaller pages to one larger page using the queue.

5. The method of claim 1, further comprising assigning the S-stripes differing widths based on the compressibility score, S.

6. The method of claim 1, further comprising:
determining a page cannot be decompressed;
declaring the page as being corrupt;
using RAID mechanisms to rebuild the page;
fixing a corrupt page after the page is rebuilt;
returning correct data to a user; and
if the rebuild fails, returning an error message to the user.

7. An apparatus, comprising:
electronic hardware circuitry configured to:
read pages from 1-stripes, wherein 1-stripes are not compressed;
store compressed data in a temporary location;
read j 1-stripes, where j is greater than or equal to one;
determine compressibility score, S, for each 1-stripe of j stripes; and
fill S-stripes based on the compressibility score by writing compressed pages to S-stripes corresponding to the compressibility score, S, comprising:
fill 8-stripes before 4-stripes if 8-stripes exist by locating 8N pages with a score greater than or equal to 8;
fill 4-stripes before 2-stripes if 4-stripes exits by locating 4N pages with a score greater than or equal to 4;
fill 2-stripes before 1-stripes if 2-stripes exist by locating 2N pages with a score greater than or equal to 2,
wherein N>1 and N equals the number of disks minus K, and K is the number of parity disks where K>1.

8. The apparatus of claim 7, wherein the circuitry comprises at least one of a processor, a memory, a programmable logic device or a logic gate.

9. The apparatus of claim 7, further comprising circuitry to:
store in the system's data cache uncompressed; and
after the data reaches the persistent uncompressed data cache; acknowledge the write.

10. The apparatus of claim 7, further comprising circuitry to add a queue for a different compression level.

11. The apparatus of claim 7, further comprising circuitry to:
add a queue; and
destage smaller pages to one larger page using the queue.

12. The apparatus of claim 7, further comprising circuitry to assign stripes of different widths.

13. The apparatus of claim 7, further comprising circuitry to:
determine a page cannot be decompressed;
declare the page as being corrupt;
use RAID mechanisms to rebuild the page;
fix corrupt page after the page is rebuilt;
return correct data to a user; and
if the rebuild fails, return an error message to the user.

14. An article comprising:
a non-transitory computer-readable medium that stores computer-executable instructions, the instructions causing a machine to:
read pages from 1-stripes, wherein 1-stripes are not compressed;
store compressed data in a temporary location;
read j 1-stripes, where j is greater than or equal to one;
determine compressibility score, S, for each 1-stripe of j stripes; and
fill S-stripes based on the compressibility score by writing compressed pages to S-stripes corresponding to the compressibility score, S, comprising:
fill 8-stripes before 4-stripes if 8-stripes exist by locating 8N pages with a score greater than or equal to 8;
fill 4-stripes before 2-stripes if 4-stripes exits by locating 4N pages with a score greater than or equal to 4;
fill 2-stripes before 1-stripes if 2-stripes exist by locating 2N pages with a score greater than or equal to 2,
wherein N>1 and N equals the number of disks minus K, and K is the number of parity disks where K>1.

15. The article of claim 14, further comprising instructions causing the machine to:
store in the system's data cache uncompressed; and
after the data reaches the persistent uncompressed data cache; acknowledge the write.

16. The article of claim 14, further comprising instructions causing the machine to add a queue for a different compression level.

17. The article of claim 14, further comprising instructions causing the machine to:
add a queue; and
destage smaller pages to one larger page using the queue.

18. The article of claim 14, further comprising instructions causing the machine to assign stripes of different widths.

19. The article of claim 14, further comprising instructions causing the machine to:
determine a page cannot be decompressed;
declare the page as being corrupt;
use RAID mechanisms to rebuild the page;
fix a corrupt page after the page is rebuilt;
return correct data to a user; and
if the rebuild fails, return an error message to the user.

* * * * *